(12) United States Patent
Park et al.

(10) Patent No.: US 12,471,360 B2
(45) Date of Patent: *Nov. 11, 2025

(54) SEMICONDUCTOR DEVICE INCLUDING KEY REGION AND KEY PATTERN AND METHOD OF FABRICATING THE SAME

(71) Applicant: SAMSUNG ELECTRONICS CO., LTD., Suwon-si (KR)

(72) Inventors: Sungsik Park, Suwon-si (KR); Jeonghyun Kim, Suwon-si (KR); Jonghwa Baek, Suwon-si (KR); Hyunju Song, Suwon-si (KR); Bumjoon Youn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 481 days.

This patent is subject to a terminal disclaimer.

(21) Appl. No.: 18/094,786

(22) Filed: Jan. 9, 2023

(65) Prior Publication Data
US 2023/0352421 A1 Nov. 2, 2023

(30) Foreign Application Priority Data
Apr. 29, 2022 (KR) .................. 10-2022-0053412

(51) Int. Cl.
*H10D 84/83* (2025.01)
*H10D 30/67* (2025.01)

(52) U.S. Cl.
CPC ......... *H10D 84/83* (2025.01); *H10D 30/6735* (2025.01)

(58) Field of Classification Search
CPC ............ H10D 30/019; H10D 30/6735; H10D 84/832; H10D 84/83; H10D 64/017; H10D 30/014; H10D 30/43
See application file for complete search history.

(56) References Cited

U.S. PATENT DOCUMENTS

| | | | |
|---|---|---|---|
| 8,822,343 B2 | 9/2014 | Hsieh et al. | |
| 9,379,017 B1 | 6/2016 | Sung et al. | |
| 9,543,406 B2 | 1/2017 | Wang et al. | |
| 9,812,364 B2 | 11/2017 | Kim | |
| 10,553,429 B2 | 2/2020 | Ham et al. | |
| 10,733,354 B2 | 8/2020 | Kim et al. | |
| 11,056,440 B2 | 7/2021 | Chen | |
| 11,119,416 B2 | 9/2021 | Sun et al. | |
| 2016/0020149 A1 | 1/2016 | Kim et al. | |
| 2024/0355757 A1* | 10/2024 | Kim ...................... | H01L 23/544 |

FOREIGN PATENT DOCUMENTS

| | | |
|---|---|---|
| KR | 102184994 B1 | 12/2020 |
| KR | 102311186 B1 | 10/2021 |

* cited by examiner

*Primary Examiner* — Changhyun Yi
(74) *Attorney, Agent, or Firm* — Sughrue Mion, PLLC

(57) ABSTRACT

A semiconductor device includes a substrate including a key region, a dummy active pattern provided on the key region, a dummy channel pattern provided on the dummy active pattern, the dummy channel pattern including a first plurality of semiconductor patterns spaced apart from each other, an epitaxial pattern connected to the dummy channel pattern, and a first sub-key pattern provided on the dummy channel pattern. The first sub-key pattern encloses a top surface, a bottom surface, and side surfaces of each of the first plurality of semiconductor patterns.

20 Claims, 35 Drawing Sheets

SEMICONDUCTOR DEVICE INCLUDING KEY REGION AND KEY PATTERN AND METHOD OF FABRICATING THE SAME

CROSS-REFERENCE TO RELATED APPLICATIONS

This application is based on and claims priority to Korean Patent Application No. 10-2022-0053412, filed on Apr. 29, 2022, in the Korean Intellectual Property Office, the disclosure of which is incorporated by reference herein in its entirety.

BACKGROUND

1. Field

Example embodiments of the disclosure relate to a semiconductor device including a key pattern and a method of fabricating the same.

2. Description of Related Art

Due to their small-sized, multifunctional, and/or low-cost characteristics, semiconductor devices are important elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, structural complexity and/or integration density of semiconductor devices are being increased.

As an integration density of a semiconductor device increases, a density of patterns formed on a unit area of a substrate increases. In addition, as a semiconductor device with multiple functions and high performance is required, the number of layers formed on the substrate increases. Accordingly, a fabrication process of the semiconductor device should be performed to accurately form patterns at desired positions.

SUMMARY

Provided is a semiconductor device with improved reliability.

Provided is a method of improving performance of an overlay measurement step performed during a process of fabricating a semiconductor device.

Additional aspects will be set forth in part in the description which follows and, in part, will be apparent from the description, or may be learned by practice of the presented embodiments.

According to an aspect of an example embodiment, a semiconductor device may include a substrate including a key region, a dummy active pattern provided on the key region, a dummy channel pattern provided on the dummy active pattern, the dummy channel pattern including a first plurality of semiconductor patterns spaced apart from each other, an epitaxial pattern connected to the dummy channel pattern, and a first sub-key pattern provided on the dummy channel pattern. The first sub-key pattern may enclose a top surface, a bottom surface, and side surfaces of each of the first plurality of semiconductor patterns.

According to an aspect of an example embodiment, a semiconductor device may include a substrate including a key region, a dummy active pattern provided on the key region, a first dummy channel pattern and a second dummy channel pattern provided on the dummy active pattern, the first dummy channel pattern and the second dummy channel pattern being adjacent to each other, an epitaxial pattern provided between the first dummy channel pattern and the second dummy channel pattern, and a first sub-key pattern provided on the first dummy channel pattern. The epitaxial pattern may include a recessed top surface.

According to an aspect of an example embodiment, a semiconductor device may include a substrate including a key region, a dummy active pattern provided on the key region, a first dummy channel pattern and a second dummy channel pattern provided on the dummy active pattern and spaced apart from each other, a first sub-key pattern provided on the first dummy channel pattern, a second sub-key pattern provided on the second dummy channel pattern, and a plurality of third sub-key patterns provided between the first sub-key pattern and the second sub-key pattern. A distance between the first sub-key pattern on the first dummy channel pattern and one of the plurality of third sub-key patterns adjacent thereto may be a first pitch, a distance between the second sub-key pattern on the second dummy channel pattern and one of the plurality of third sub-key patterns adjacent thereto may be a second pitch, and the first pitch and the second pitch may be different from each other.

According to an aspect of an example embodiment, a method of fabricating a semiconductor device may include alternately stacking active layers and sacrificial layers on a substrate including a key region, forming a stacking pattern on a dummy active pattern, the stacking pattern including the active layers and the sacrificial layers, forming a sacrificial pattern on the stacking pattern, etching the stacking pattern using the sacrificial pattern as a mask to form a recess, forming an epitaxial pattern in the recess, the epitaxial pattern including a recessed top surface, and replacing the sacrificial pattern and the sacrificial layers with a first sub-key pattern.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Figure 1:
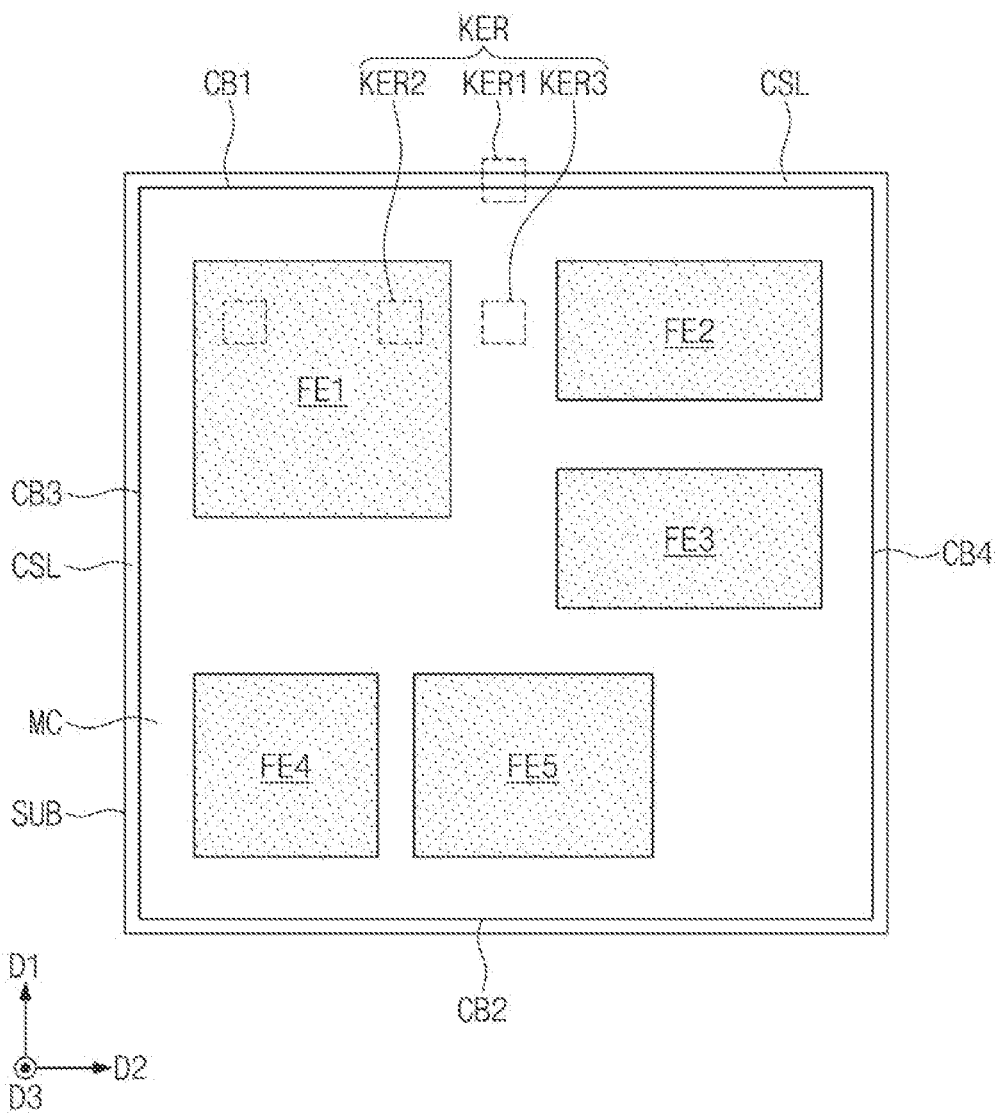
FIG. 1 is a diagram illustrating a semiconductor device according to an example embodiment.

FIG. 1 is a diagram illustrating a semiconductor device according to an example embodiment. Referring to FIG. 1, a semiconductor device may include a main chip MC and a cut scribe line CSL enclosing the main chip MC. The main chip MC may include a first functional potion FE1, a second functional portion FE2, a third functional portion FE3, a fourth functional portion FE4, and a fifth functional portion FE5 on a substrate 100. The substrate 100 may be a diced semiconductor wafer. The substrate 100 may be configured to support the first to fifth functional portions FE1-FE5.

The main chip MC may include a first border CB1, a second border CB2, a third border CB3, and a fourth border CB4. The first to fourth borders CB1-CB4 may be defined between the cut scribe line CSL and the main chip MC. The cut scribe line CSL may be configured to enclose the first to fourth borders CB1-CB4 of the main chip MC. In an embodiment, the cut scribe line CSL may include a first key region KER1 adjacent to the first border CB1 of the main chip MC. In other words, the first key region KER1 may be left on the cut scribe line CSL, after a wafer dicing process.

Each of the first to fifth functional portions FE1-FE5 may be a functional block constituting an integrated circuit. Each of the first to fifth functional portions FE1-FE5 may include one of a memory block, an analog logic block, an input/output (I/O) logic block, a central processing unit (CPU) block, and a radio-frequency block.

In an embodiment, the first functional portion FE1 may include a logic cell region CER and a second key region KER2. That is, a key region KER may be provided in not only the scribe line but also the functional block. A third key region KER3 may be provided in a region between the first functional portion FE1 and the second functional portion FE2.

According to an example embodiment, the key regions KER may include the first to third key regions KER1, KER2, and KER3 which are disposed at different positions on a semiconductor device. At least one of the first to third key regions KER1, KER2, and KER3 may be omitted from the semiconductor device (i.e., a semiconductor chip).

The key region KER may include key patterns, which will be described below. The key pattern may include an overlay key, an alignment key, or combinations thereof.

Figure 2:
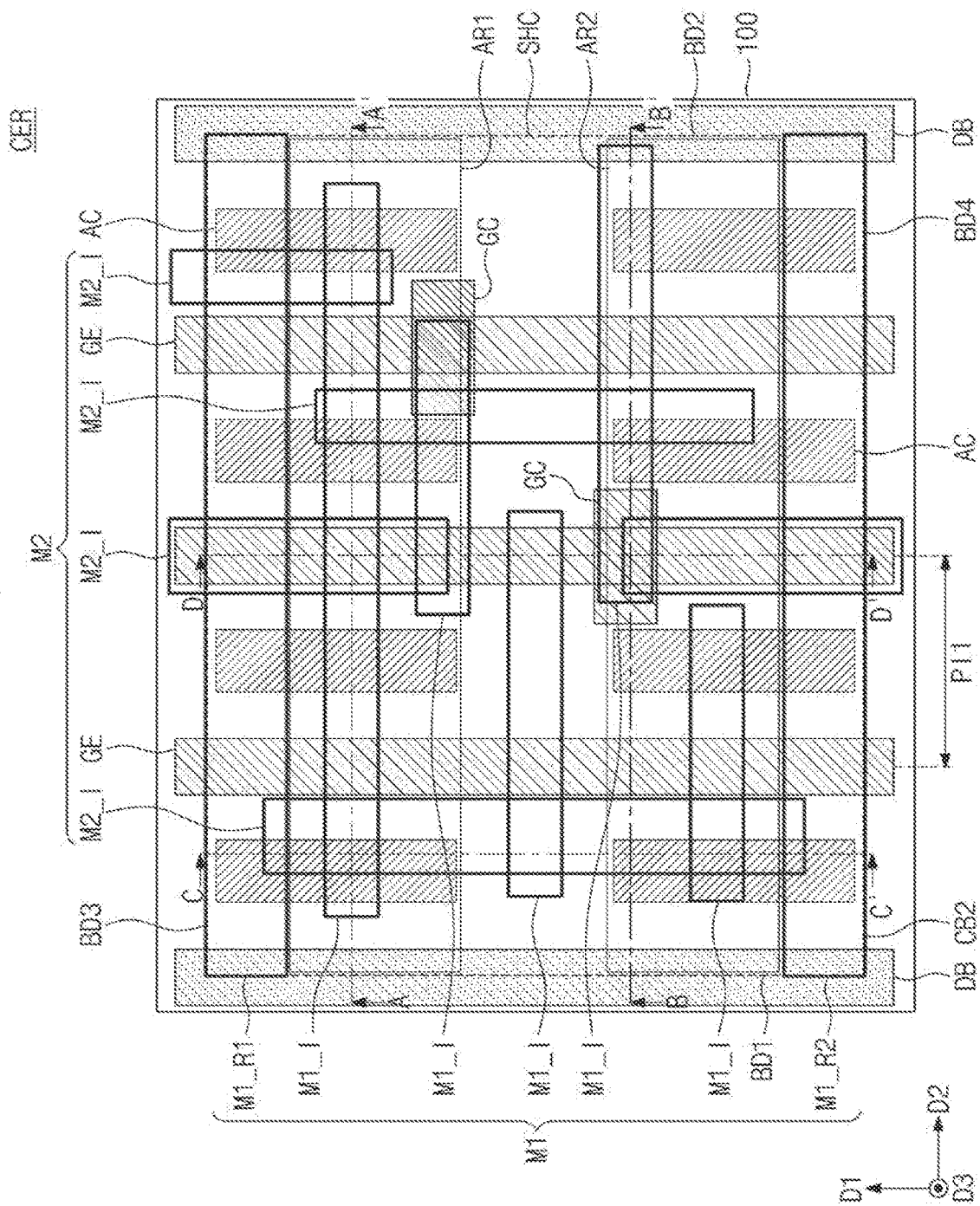
FIG. 2 is a diagram illustrating a portion of a semiconductor device according to an example embodiment.

FIG. 2 is a diagram illustrating a portion (e.g., a logic cell region of FIG. 1) of a semiconductor device according to an example embodiment. FIGS. 3A, 3B, 3C and 3D are cross-sectional views taken along lines A-A', B-B', C-C', and D-D', respectively, of FIG. 2, according to an example embodiment.

Figure 3A:
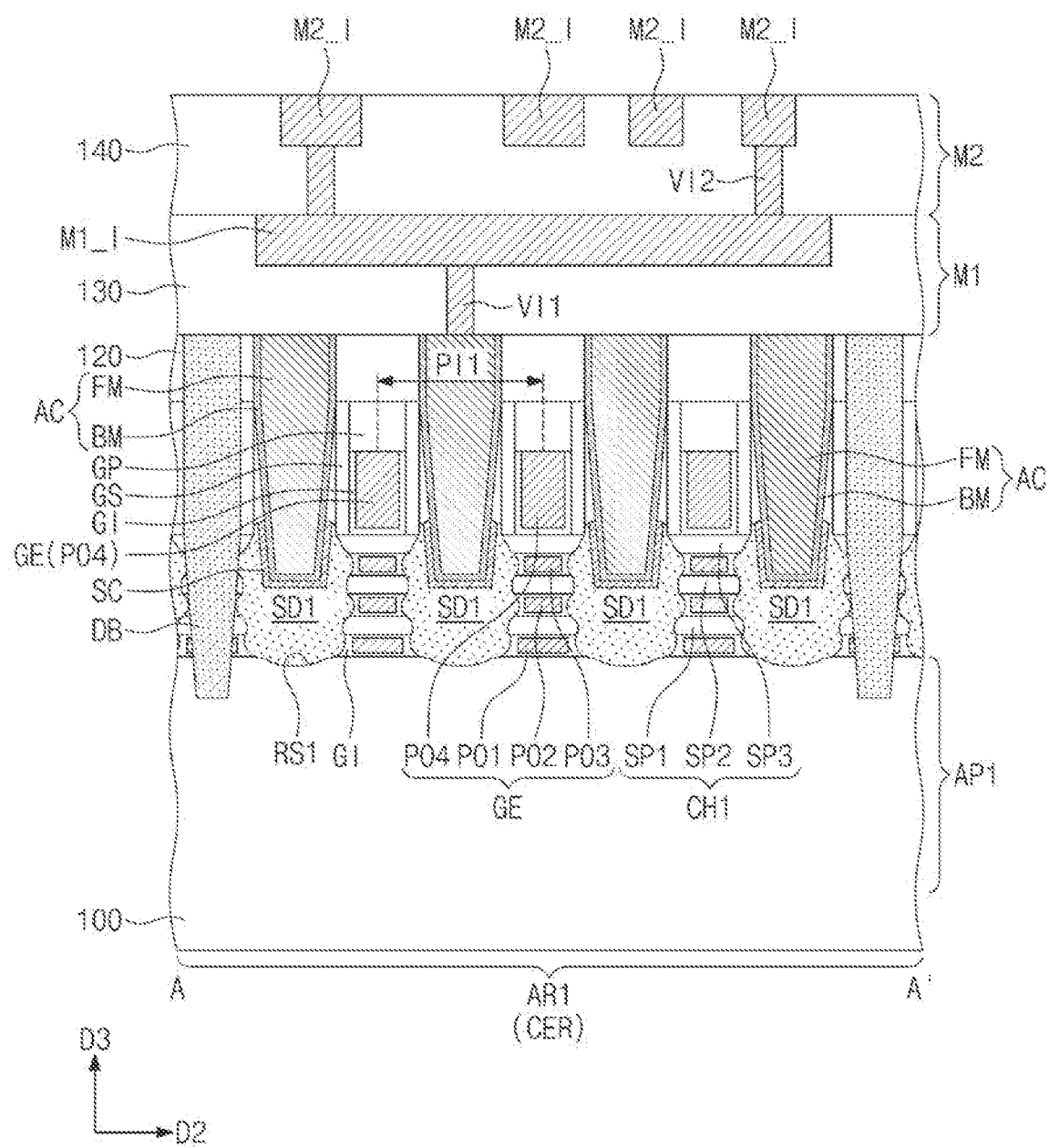
FIGS. 3A, 3B, 3C and 3D are cross-sectional views taken along lines A-A', B-B', C-C', and D-D', respectively, of FIG. 2, according to an example embodiment.
Figure 3B:
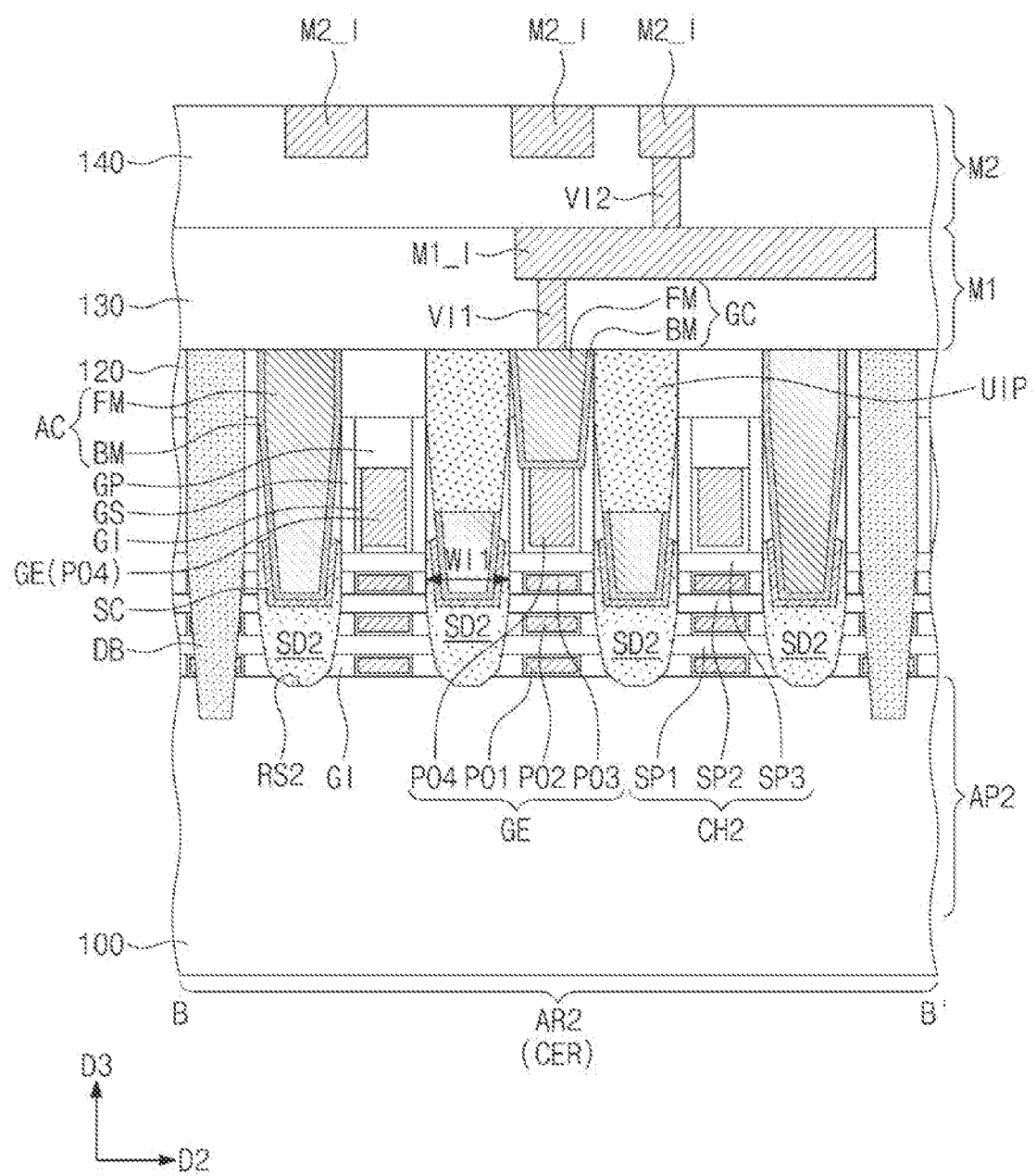
Figure 3C:
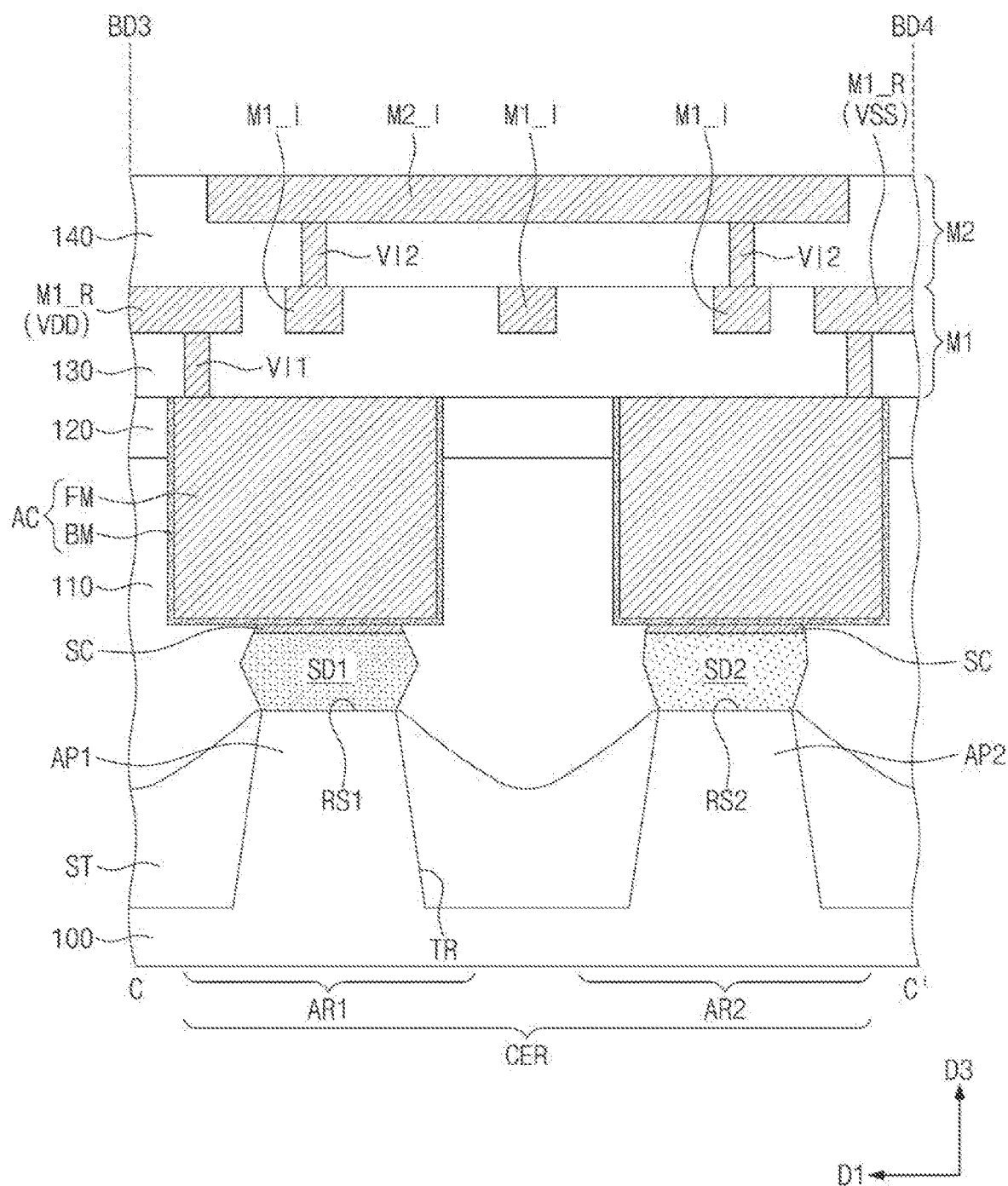
Figure 3D:
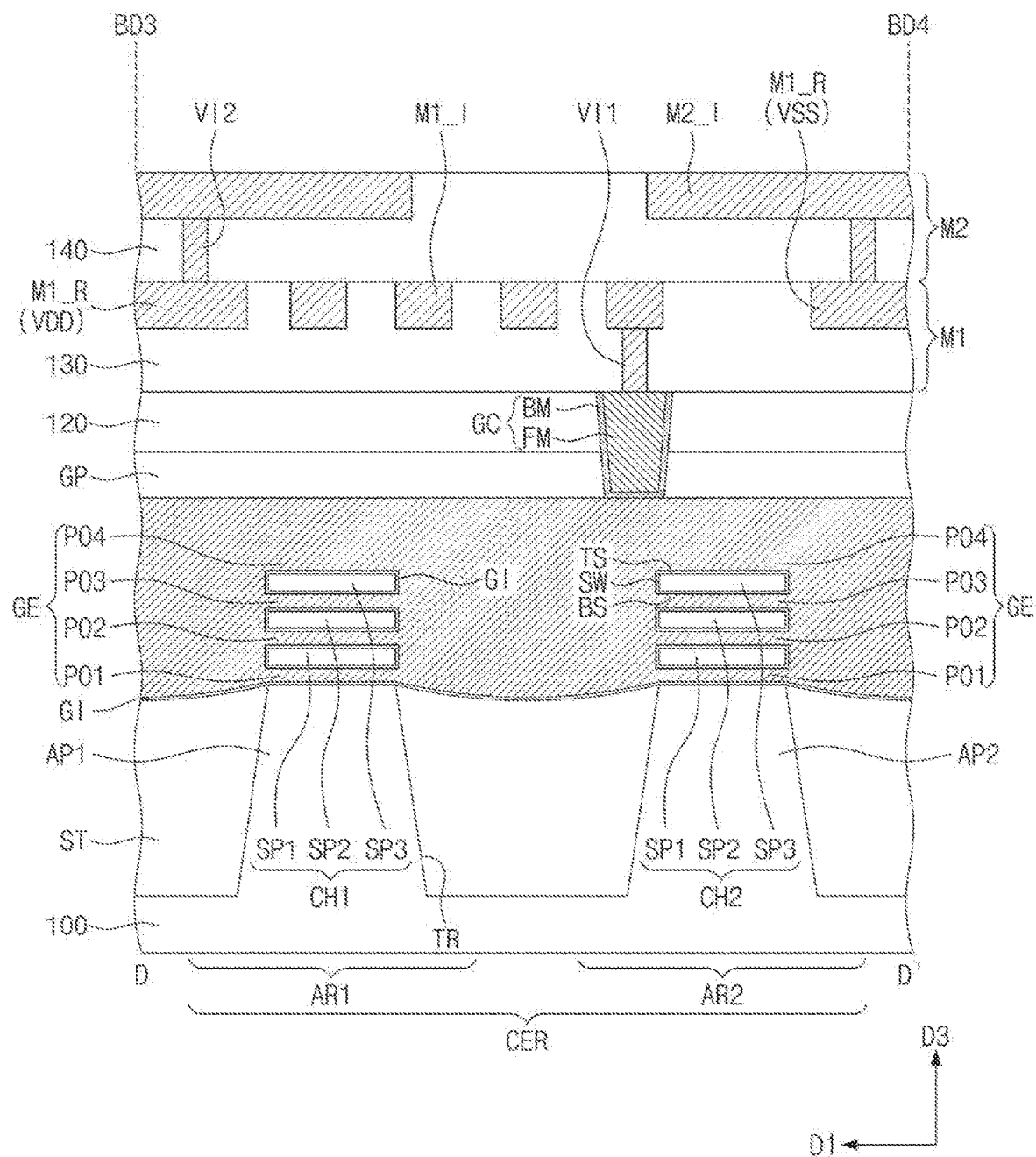

Referring to FIGS. 2 to 3D, the first functional portion FE1 of the semiconductor chip of FIG. 1 may include the logic cell region CER. The logic cell region CER may include a logic cell including a logic circuit (e.g., AND, OR, XOR, XNOR, or inverter circuit), which is configured to execute a specific function. In other words, a logic cell SHC of the logic cell region CER may include transistors constituting the logic device and interconnection lines connecting transistors to each other. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include a first active region AR1 and a second active region AR2. Each of the first and second active regions AR1 and AR2 may be extended in a second direction D2. In an embodiment, the first active region AR1 may be a p-type metal-oxide-semiconductor field-effect transistor (PMOSFET) region, and the second active region AR2 may be an n-type MOSFET (NMOSFET) region.

A first active pattern AP1 and a second active pattern AP2 may be defined by a trench TR, which is formed in an upper portion of the substrate 100. The first active pattern AP1 may be provided on the first active region AR1, and the second active pattern AP2 may be provided on the second active region AR2. The first and second active patterns AP1 and AP2 may be extended in the second direction D2. Each of the first and second active patterns AP1 and AP2 may be a vertically-protruding portion of the substrate 100.

A device isolation layer ST may be provided on the substrate 100. The device isolation layer ST may be configured to fill the trench TR. The device isolation layer ST may include a silicon oxide layer. The device isolation layer ST may not cover a first channel pattern CH1 and a second channel pattern CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be a nano sheet. That is, each of the first and second channel patterns CH1 and CH2 may be a stack including stacked nano sheets. Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. As an example, the second recess RS2 may have a first width WI1 in the second direction D2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In another embodiment, a top surface of at least one of the first and second source/drain patterns SD1 and SD2 may be located at substantially the same level as the top surface of the third semiconductor pattern SP3.

In an embodiment, the first source/drain patterns SD1 may be formed of or include a semiconductor material (e.g., SiGe) whose lattice constant is greater than that of a semiconductor material of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

A side surface of the first source/drain pattern SD1 may have an uneven or embossing shape. For example, the side surface of the first source/drain pattern SD1 may have a wavy profile. The side surface of the first source/drain pattern SD1 may protrude toward each of a first portion PO1, a second portion PO2, and a third portion PO3 of a gate electrode GE to be described below.

Gate electrodes GE may be configured to cross the first and second channel patterns CH1 and CH2 and to extend in the first direction D1. The gate electrodes GE may be arranged at a first pitch PI1 in the second direction D2 (e.g., see FIGS. 2 and 3A). Each of the gate electrodes GE may be vertically overlapped with the first and second channel patterns CH1 and CH2.

The gate electrode GE may include a first portion PO1 interposed between the active pattern AP1 or the active pattern AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Referring to FIG. 3D, the gate electrode GE may be provided on a top surface TS, a bottom surface BS, and opposite side surfaces SW of each of the first to third semiconductor patterns SP1, SP2, and SP3. The gate electrode GE may be configured to enclose the top surface TS, the bottom surface BS, and the opposite side surfaces SW of each of the first to third semiconductor patterns SP1, SP2, and SP3. That is, the transistor according to an example embodiment may be a three-dimensional field effect transistor (e.g., multi-bridge channel FET (MBCFET) or gate-all-around FET (GAAFET) in which the gate electrode GE is configured to three-dimensionally surround the channel pattern.

Referring back to FIGS. 2 and 3A to 3D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or include at least one of silicon carbon nitride (SiCN), silicon-carbon oxynitride (SiCON), or silicon nitride (SiN). In another embodiment, the gate spacers GS may have a multi-layered structure, which is formed of or includes at least two different materials selected from SiCN, SiCON, and SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of silicon oxynitride (SiON), SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an embodiment, the gate insulating layer GI may include an interface layer and a high-k dielectric layer. The interface layer may include a silicon oxide layer or a silicon oxynitride layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from about 3 atomic percentage (at %) to about 8 at %. The content of the dopants (e.g., aluminum atoms) may be a ratio of the number of aluminum atoms to the number of hafnium and aluminum atoms.

In the case where the dopants are silicon (Si), a content of silicon in the ferroelectric layer may range from about 2 at % to about 10 at %. In the case where the dopants are yttrium (Y), a content of yttrium in the ferroelectric layer may range from about 2 at % to about 10 at %. In the case where the dopants are gadolinium (Gd), a content of gadolinium in the ferroelectric layer may range from about 1 at % to about 7 at %. In the case where the dopants are zirconium (Zr), a content of zirconium in the ferroelectric layer may range from about 50 at % to about 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the disclosure is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from about 0.5 to about 10 nm, but the disclosure is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring to FIG. 3B, inner spacers IP may be provided on the second active pattern AP2. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

Referring back to FIGS. 2 and 3A to 3D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, a transistor having a desired threshold voltage may be realized. For example, the first to third portions PO1, PO2, and PO3 of the gate electrode GE may be composed of the first metal pattern or the work-function metal.

The first metal pattern may include a metal nitride layer. For example, the first metal pattern may include a layer that includes at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

The logic cell SHC may have a first border BD1 and a second border BD2, which are opposite to each other in the second direction D2. The first and second borders BD1 and BD2 may be extended in the first direction D1. The logic cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be provided at both sides of the logic cell SHC. For example, the pair of the division structures DB may be respectively provided on the first and second borders BD1 and BD2 of the logic cell SHC. The division structure DB may be extended in the first direction D1 to be parallel to the gate electrodes GE. A pitch between the division structure DB and the gate electrode GE, which are adjacent to each other, may be substantially equal to the first pitch PI1.

The division structure DB may be configured to penetrate the first and second interlayer insulating layers 110 and 120 and may be extended into the first and second active patterns AP1 and AP2. The division structure DB may be configured to penetrate an upper portion of each of the first and second active patterns AP1 and AP2. The division structure DB may electrically separate an active region of each of the logic cell SHC from an active region of a neighboring cell.

Active contacts AC may be configured to penetrate the first and second interlayer insulating layers 110 and 120 and may be configured to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. The active contact AC may cover a portion of the top surface of the gate capping pattern GP.

The active contacts AC may be arranged at the first pitch PI1 in the second direction D2. For example, a pitch between the active contacts AC may be substantially equal to the first pitch PI1 between the gate electrodes GE.

Metal-semiconductor compound layers SC (e.g., a silicide layer) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Gate contacts GC may be configured to penetrate the second interlayer insulating layer 120 and the gate capping pattern GP and to be electrically connected to the gate electrodes GE, respectively. When viewed in a plan view, the gate contacts GC may be respectively disposed to be overlapped with the first and second active regions AR1 and AR2. In an embodiment, the gate contact GC may be provided on the second active pattern AP2 (e.g., see FIG. 3B).

In an embodiment, referring to FIG. 3B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, the gate contact GC and the active contact AC, which are adjacent to each other, may be prevented from being in contact with each other and thereby to prevent a short circuit issue from occurring therebetween.

Each of the active contact AC and gate contact GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be configured to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include a first power line M1_R1, a second power line M1_R2, and first interconnection lines M1_I. The interconnection lines M1_R1, M1_R2, and M1_I of the first metal layer M1 may be extended in the second direction D2 to be parallel to each other.

In detail, the first and second power lines M1_R1 and M1_R2 may be respectively provided on the third and fourth borders BD3 and BD4 of the logic cell SHC. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a specific pitch in the first direction D1. As an example, the pitch between the first interconnection lines M1_I may be less than the first pitch PI1. A linewidth of each of the first interconnection lines M1_I may be less than a linewidth of each of the first and second power lines M1_R1 and M1_R2.

The first metal layer M1 may further include first vias VI1. The first vias VI1 may be respectively provided below the first and second power lines M1_R1 and M1_R2, and the first interconnection lines M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to an example embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt). A plurality of metal layers may be additionally stacked on the fourth interlayer insulating layer 140. Each of the stacked metal layers may include interconnection lines, which are used as routing paths between cells.

Figure 4:
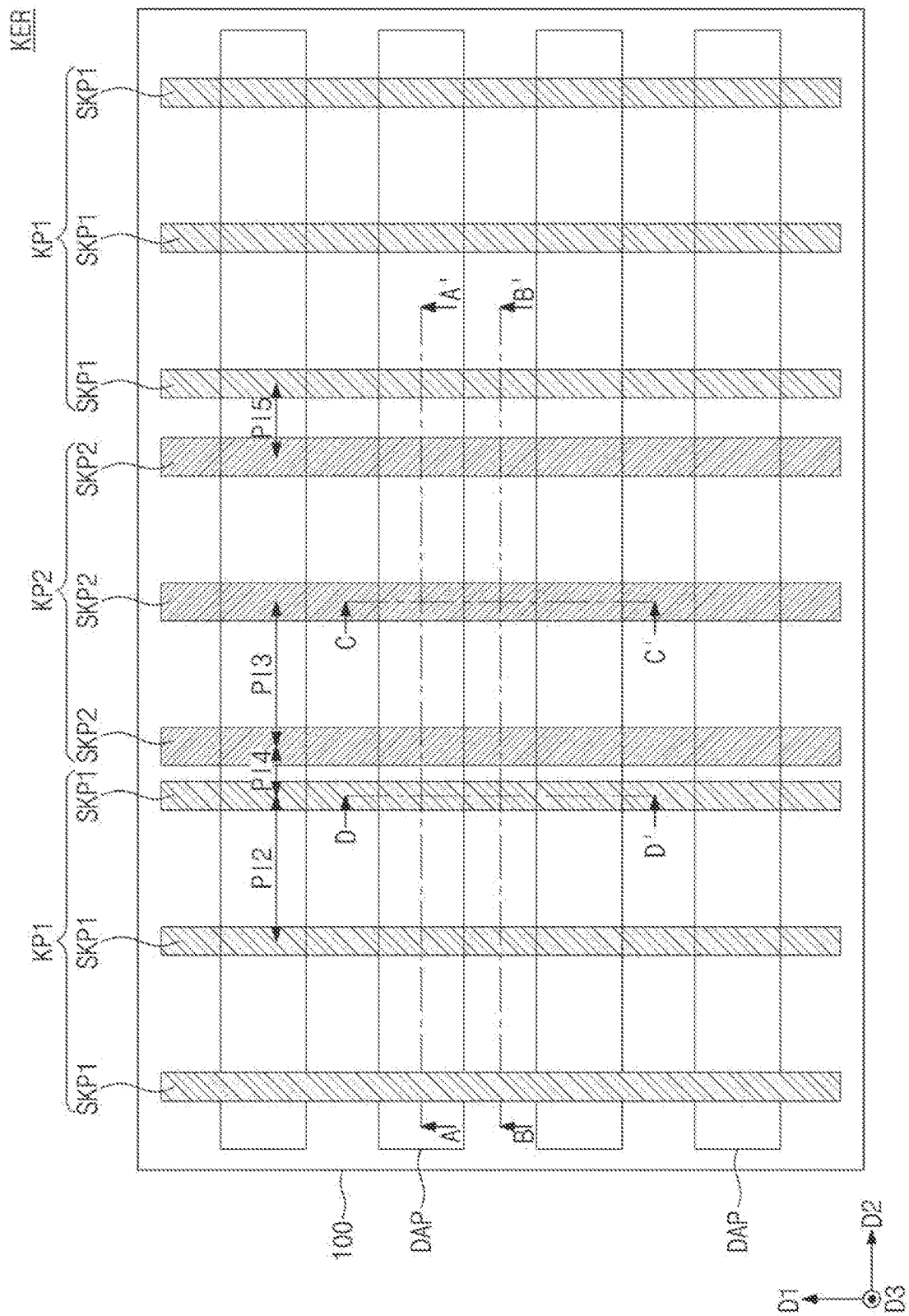
FIG. 4 is a diagram illustrating a portion of a semiconductor device according to an example embodiment.

FIG. 4 is a diagram illustrating a portion (e.g., a key region of FIG. 1) of a semiconductor device according to an example embodiment. FIGS. 5A, 5B, 5C, and 5D are cross-sectional views taken along lines A-A', B-B', C-C', and D-D', respectively, of FIG. 4 according to an example embodiment.

FIG. 4 illustrates an example of the key region KER, which is provided in one of the first to third key regions KER1, KER2, and KER3 of the semiconductor chip shown in FIG. 1. For example, the key region KER of FIG. 4 may illustrate the first key region KER1 in the cut scribe line CSL of FIG. 1.

The key region KER may include first key patterns KP1 and second key pattern KP2, which are used in a process of fabricating semiconductor chip. Each of the key patterns KP1 and KP2 may include an overlay key, an alignment key, or combinations thereof.

The first key patterns KP1 may be a lower key structure. The second key patterns KP2 may be an upper key structure. In an embodiment, the first key patterns KP1 may be a lower overlay key, and the second key patterns KP2 may be an upper overlay key. An alignment between lower and upper layers may be determined by measuring an alignment of the first and second key patterns KP1 and KP2.

The first key pattern KP1 may include first sub-key patterns SKP1. The first sub-key patterns SKP1 may be line-shaped patterns which are extended in the first direction D1 and are parallel to each other. For example, the first key pattern KP1 may include three first sub-key patterns SKP1. The three first sub-key patterns SKP1 may be arranged at a second pitch PI2 in the second direction D2.

The second pitch PI2 may be greater than the first pitch PI1 between the gate electrodes GE previously described with reference to FIGS. 2 and 3A to 3D. For example, the second pitch PI2 may be 1.5 to 4 times the first pitch PI1.

Different ones of the first key patterns KP1 may be spaced apart from each other in the second direction D2. The second key pattern KP2 may be disposed between the different ones of the first key pattern KP1. For example, the second key pattern KP2 may include three second sub-key patterns SKP2. The second sub-key patterns SKP2 may be line-shaped patterns which are extended in the first direction D1 and are parallel to each other. The three second sub-key patterns SKP2 may be arranged at a third pitch PI3 in the second direction D2. The third pitch PI3 may be substantially equal to or different from the second pitch PI2.

The first sub-key pattern SKP1 and the second sub-key pattern SKP2 may be adjacent to each other in the second direction D2. A pitch between the first sub-key pattern SKP1 and the second sub-key pattern SKP2, which are adjacent to each other, may be a fourth pitch PI4.

The second sub-key pattern SKP2 and the first sub-key pattern SKP1 may be adjacent to each other in the second direction D2. A pitch between the second sub-key pattern SKP2 and the first sub-key pattern SKP1, which are adjacent to each other, may be a fifth pitch PI5. The fifth pitch PI5 may be less than the second pitch PI2. In an embodiment, the fifth pitch PI5 may be greater than the fourth pitch PI4. For example, a difference between the fourth pitch PI4 and the fifth pitch PI5 may be about 10 nm to about 30 nm.

Referring to FIGS. 4 and 5A to 5D, a plurality of dummy active patterns DAP may be provided on the key region KER of the substrate 100. The dummy active patterns DAP may be arranged in the first direction D1. The dummy active patterns DAP may be extended in the second direction D2. The dummy active patterns DAP may be formed simultaneously when the first and second active patterns AP1 and AP2 on the logic cell region CER are formed. The device isolation layer ST may be configured to fill the trench TR between the dummy active patterns DAP.

A dummy channel pattern DCH may be provided on the dummy active patterns DAP. The dummy channel pattern DCH may include the first semiconductor pattern SP1, the second semiconductor pattern SP2, and the third semiconductor pattern SP3, which are sequentially stacked. The first to third semiconductor patterns SP1, SP2, and SP3 may be spaced apart from each other in a vertical direction (i.e., the third direction D3). Each of the first to third semiconductor patterns SP1, SP2, and SP3 may be a nano sheet. For example, the dummy channel pattern DCH may be a stack including stacked nano sheets. The dummy channel pattern DCH may be formed simultaneously when the first and second channel patterns CH1 and CH2 on the logic cell region CER are formed.

A third recess RS3 may be defined between the dummy channel patterns DCH, which are adjacent to each other in the first direction D1. The third recess RS3 may be formed simultaneously when the first and second recesses RS1 and RS2 on the logic cell region CER are formed. The third recess RS3 may have a second width WI2 in the first direction D1. The second width WI2 may be greater than the first width WI1 of the second recess RS2 described above.

An epitaxial pattern EPP may be configured to fill the third recess RS3. The epitaxial pattern EPP may connect adjacent ones of the dummy channel patterns DCH to each other. In an embodiment, the epitaxial pattern EPP may be formed simultaneously when the second source/drain pattern SD2 on the logic cell region CER are formed. The epitaxial pattern EPP may include a silicon epitaxial pattern.

The epitaxial pattern EPP in the third recess RS3 may have a U-shaped section in the second direction D2. The epitaxial pattern EPP may include a recessed top surface RTS. This may be because the third recess RS3 has a width greater than the second recess RS2 on the logic cell region CER or the epitaxial pattern EPP is not formed to fill the entirety of the third recess RS3. A height of the epitaxial pattern EPP may be decreased and then increased when measured in a direction from the dummy channel pattern DCH to another dummy channel pattern DCH adjacent thereto.

A fourth recess RS4 may be defined in a region between adjacent ones of the first key patterns KP1. A width of the fourth recess RS4 in the first direction D1 may be greater than a width of the third recess RS3. As an example, a bottom of the fourth recess RS4 may be lower than a bottom of the third recess RS3. The epitaxial pattern EPP may be provided in the fourth recess RS4. The epitaxial pattern EPP in the fourth recess RS4 may also be formed to have the recessed top surface RTS.

The first sub-key patterns SKP1 may be configured to cross the dummy active patterns DAP and to extend in the first direction D1. The first sub-key patterns SKP1 may be formed simultaneously when the gate electrodes GE on the logic cell region CER are formed. In other words, the first sub-key pattern SKP1 may be configured to have substantially the same features as the gate electrode GE on the logic cell region CER described above.

As described above, the first sub-key patterns SKP1 may be arranged at the second pitch PI2 in the second direction D2. The second pitch PI2 may be greater than the first pitch PI1 between the gate electrodes GE. In an embodiment, a width of the first sub-key pattern SKP1 in the second direction D2 may be equal to or greater than a width of the gate electrode GE on the logic cell region CER.

The first sub-key pattern SKP1 may include the first portion PO1 interposed between the dummy active patterns DAP and the first semiconductor pattern SP1, the second portion PO2 interposed between the first semiconductor pattern SP1 and the second semiconductor pattern SP2, the third portion PO3 interposed between the second semiconductor pattern SP2 and the third semiconductor pattern SP3, and the fourth portion PO4 on the third semiconductor pattern SP3.

Figure 5A:
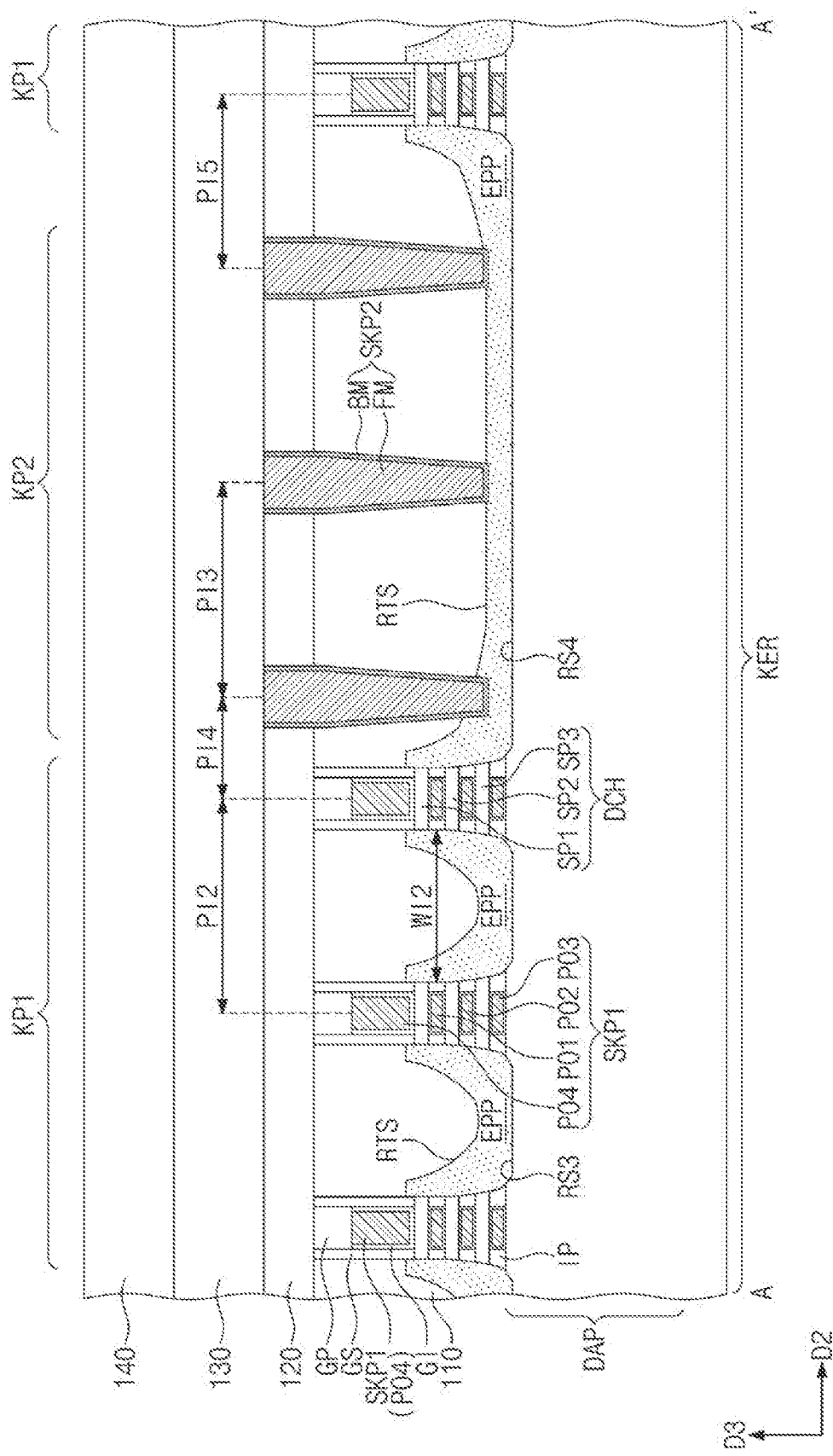
FIGS. 5A, 5B, 5C, and 5D are cross-sectional views taken along lines A-A', B-B', C-C', and D-D', respectively, of FIG. 4 according to an example embodiment.
Figure 5B:
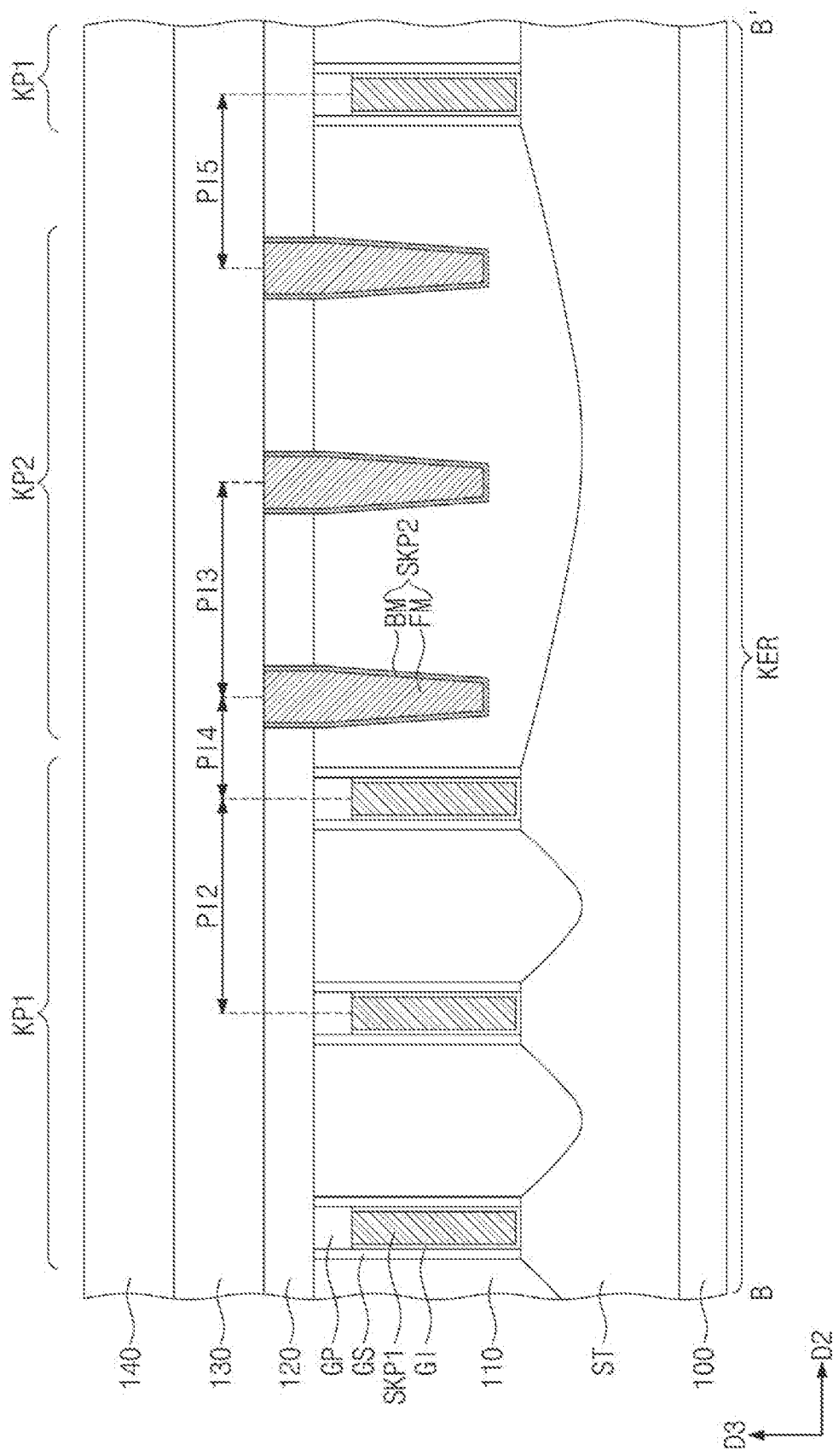
Figure 5C:
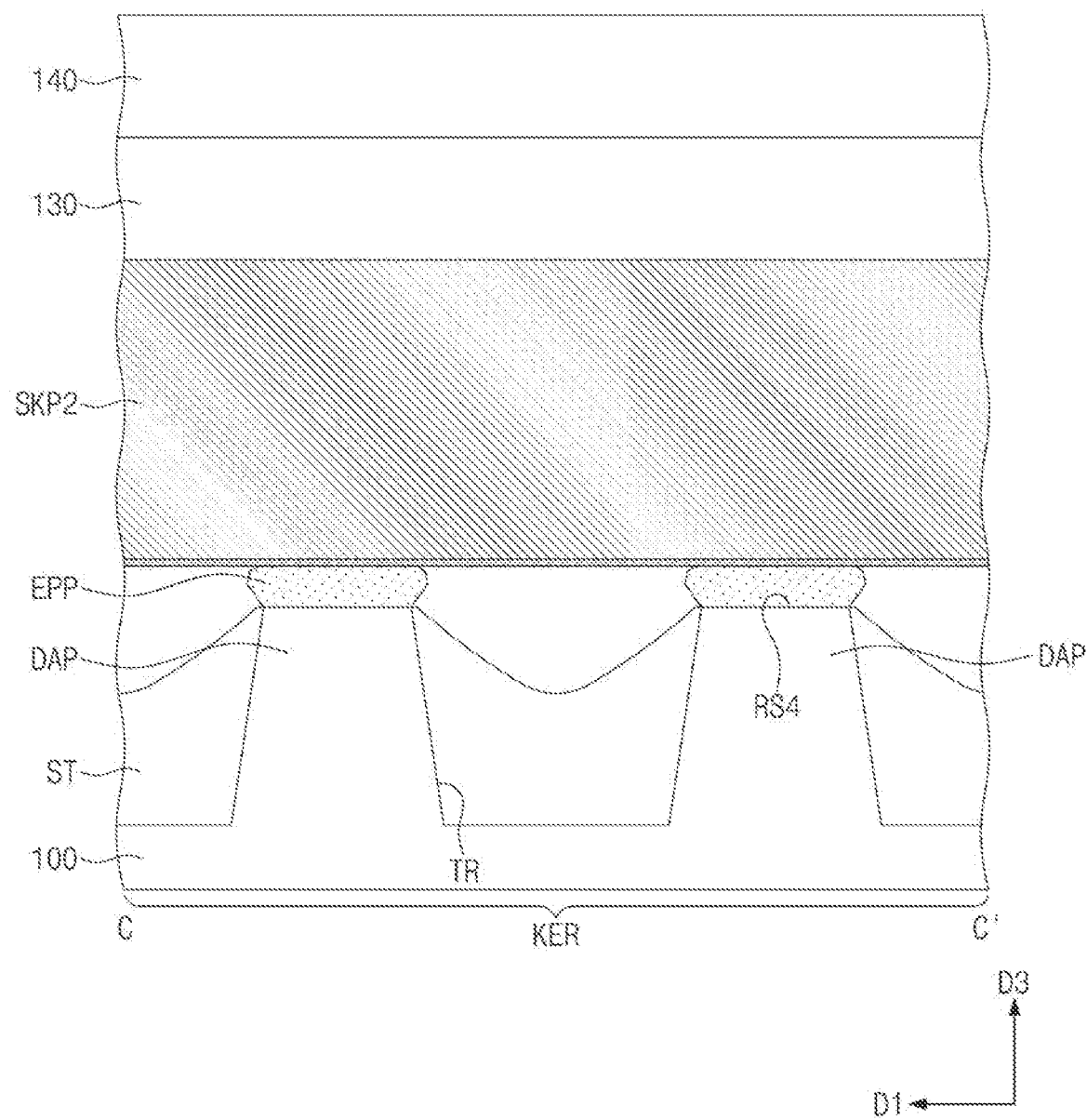
Figure 5D:
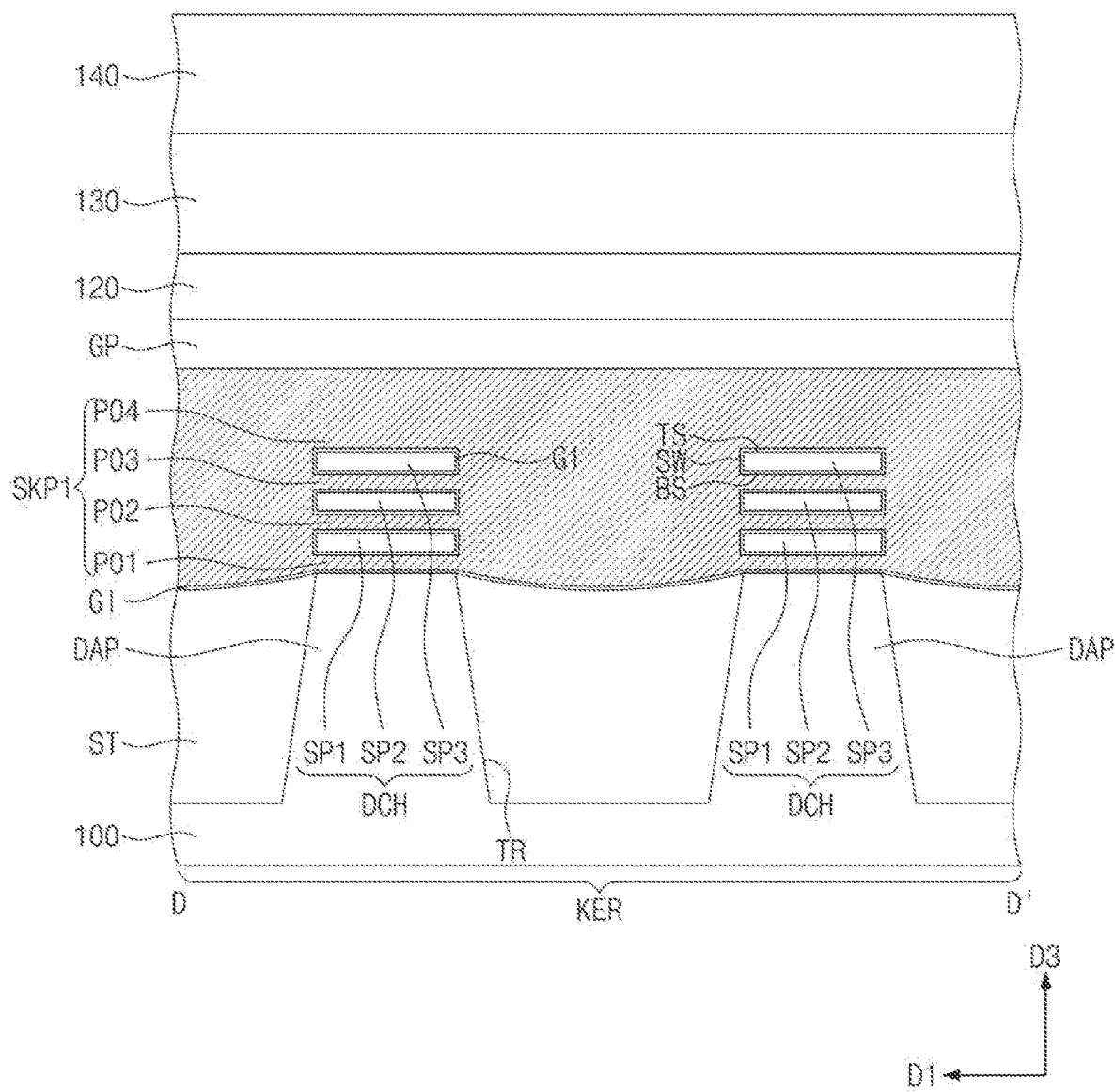
Figure 6:
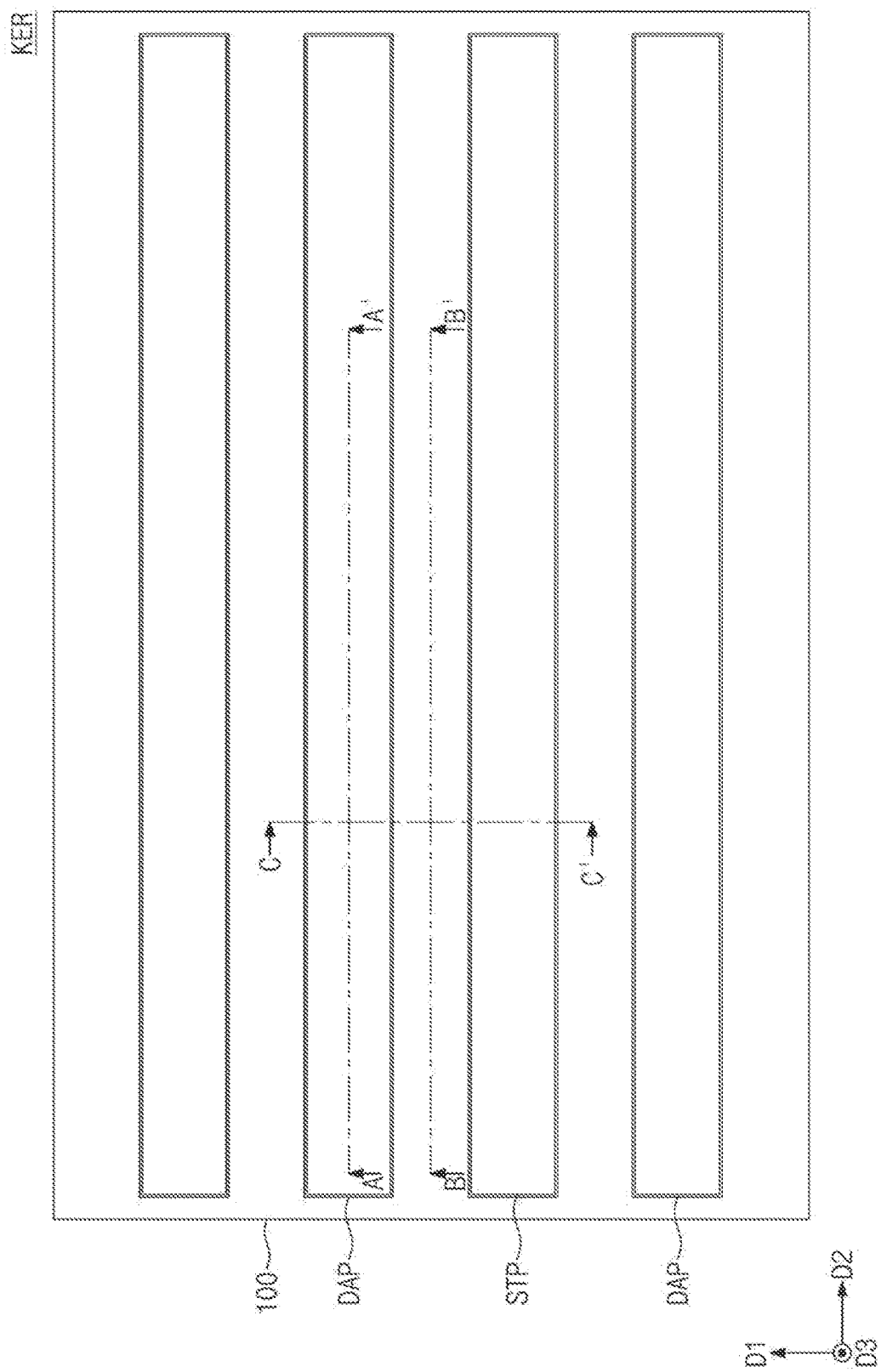
FIGS. 6, 8, 10, 12, and 14 are diagrams illustrating a method of fabricating a semiconductor device according to an example embodiment.
Figure 7A:
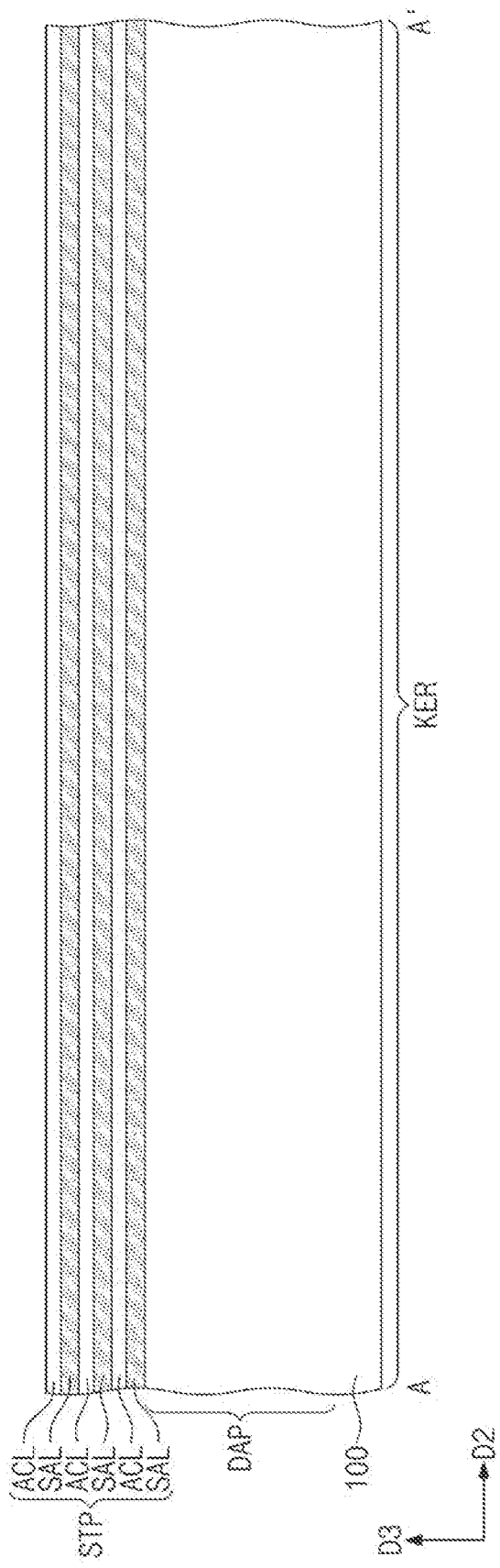
FIGS. 7A, 9A, 11A, 13A, and 15A are cross-sectional views taken along lines A-A' of FIGS. 6, 8, 10, 12, and 14, respectively, according to an example embodiment.
Figure 7B:
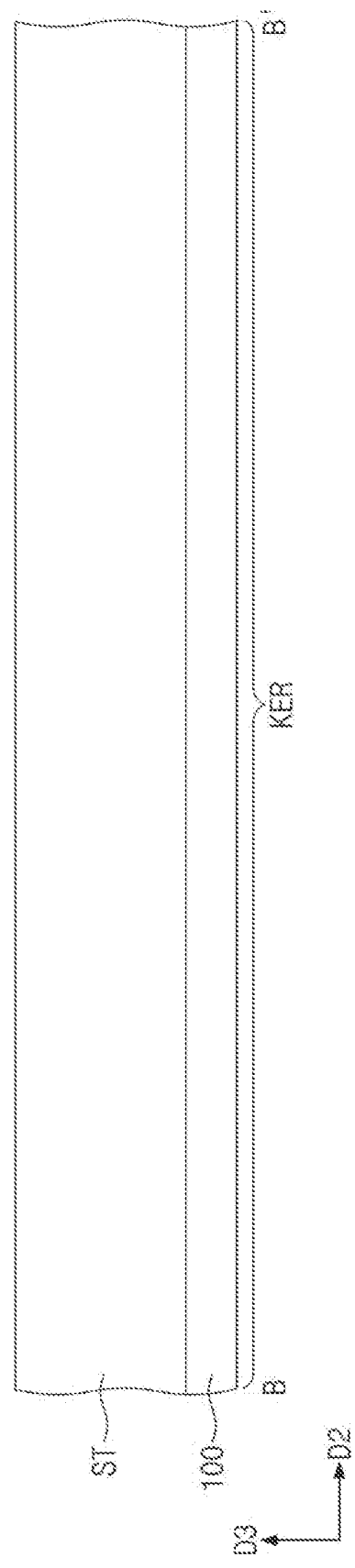
FIGS. 7B, 9B, 11B, 13B, and 15B are cross-sectional views taken along lines B-B' of FIGS. 6, 8, 10, 12, and 14, respectively, according to an example embodiment.
Figure 7C:
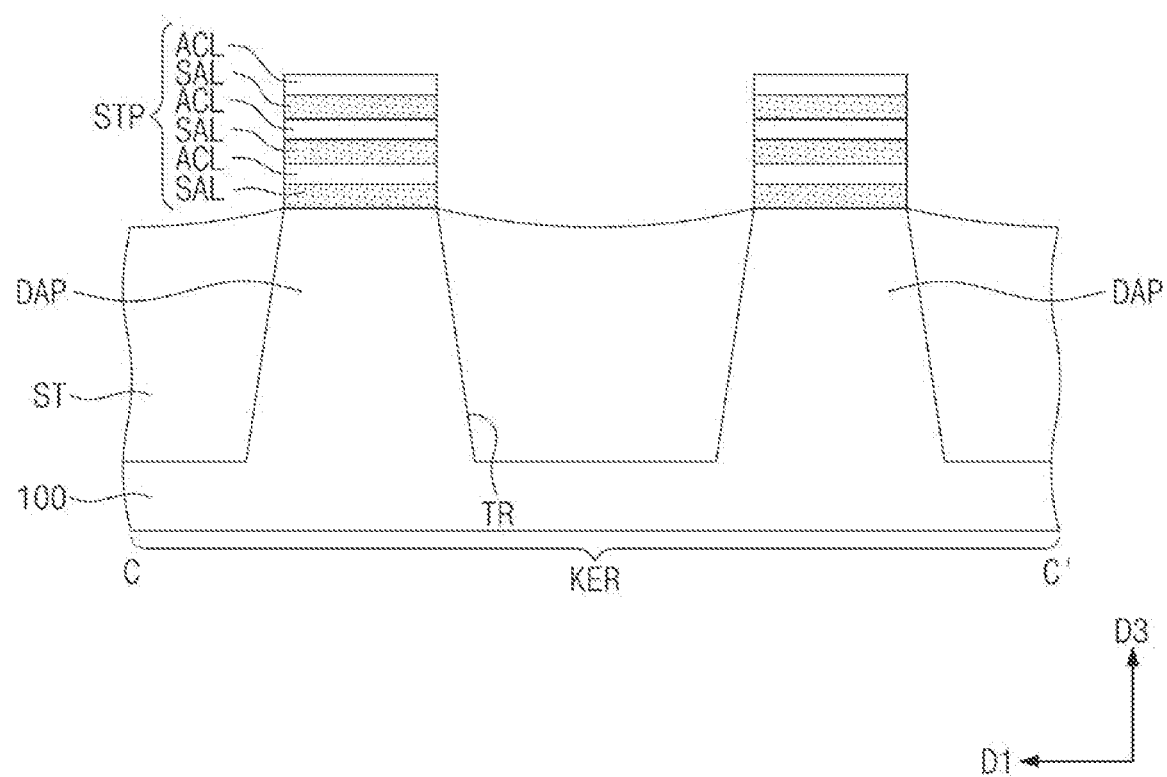
FIGS. 7C, 9C, 11C, 13C, and 15C are cross-sectional views taken along lines C-C' of FIGS. 6, 8, 10, 12, and 14, respectively, according to an example embodiment.
Figure 8:
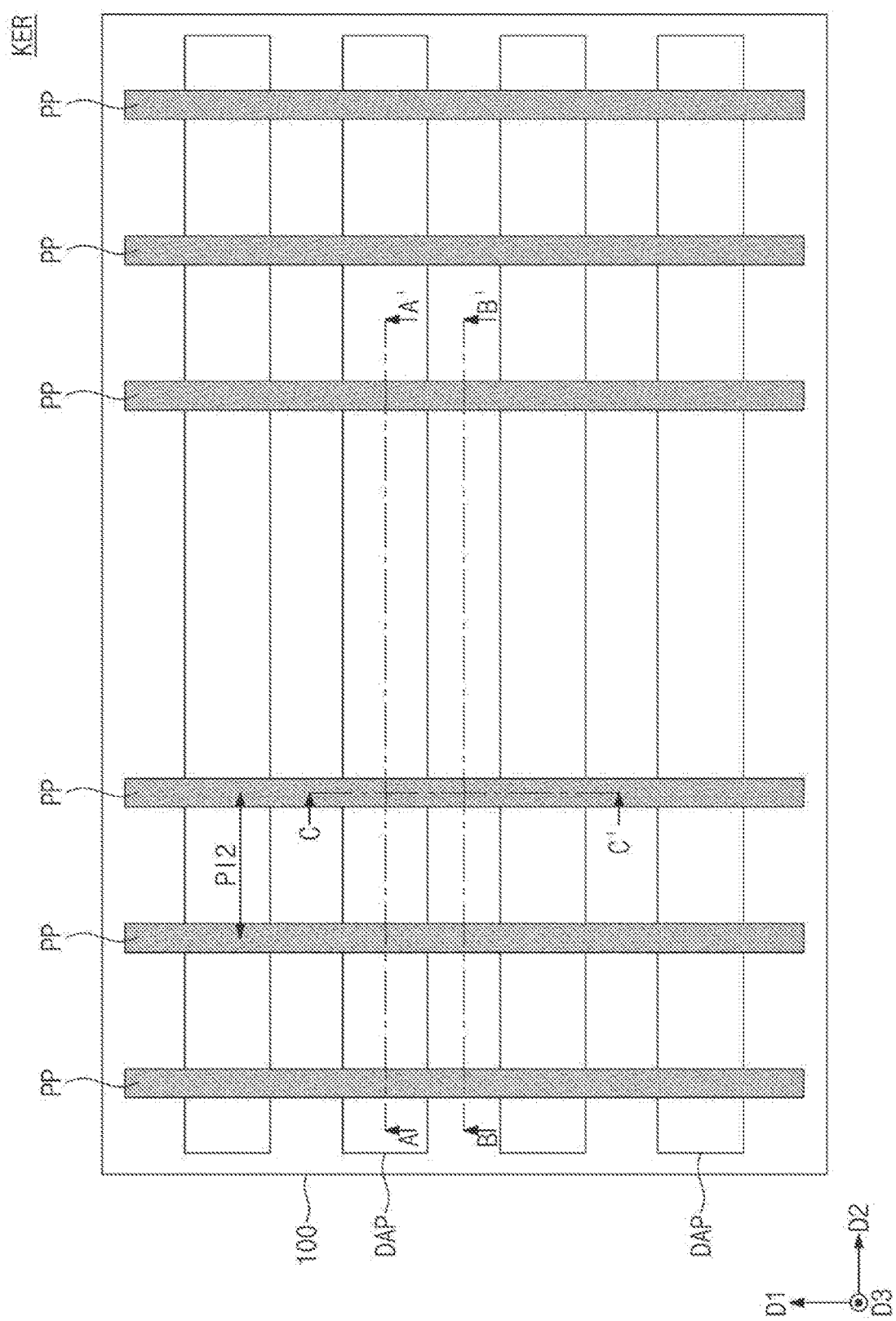
Figure 9A:
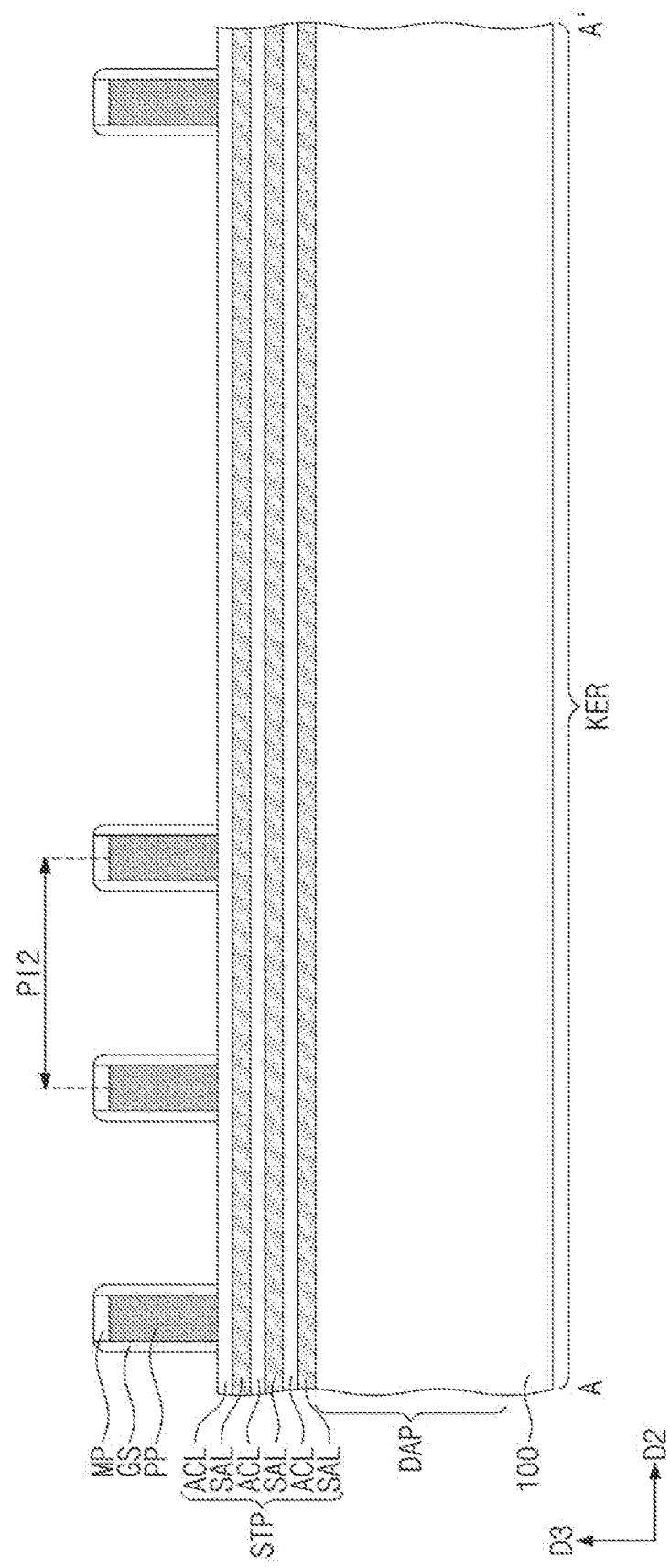
Figure 9B:
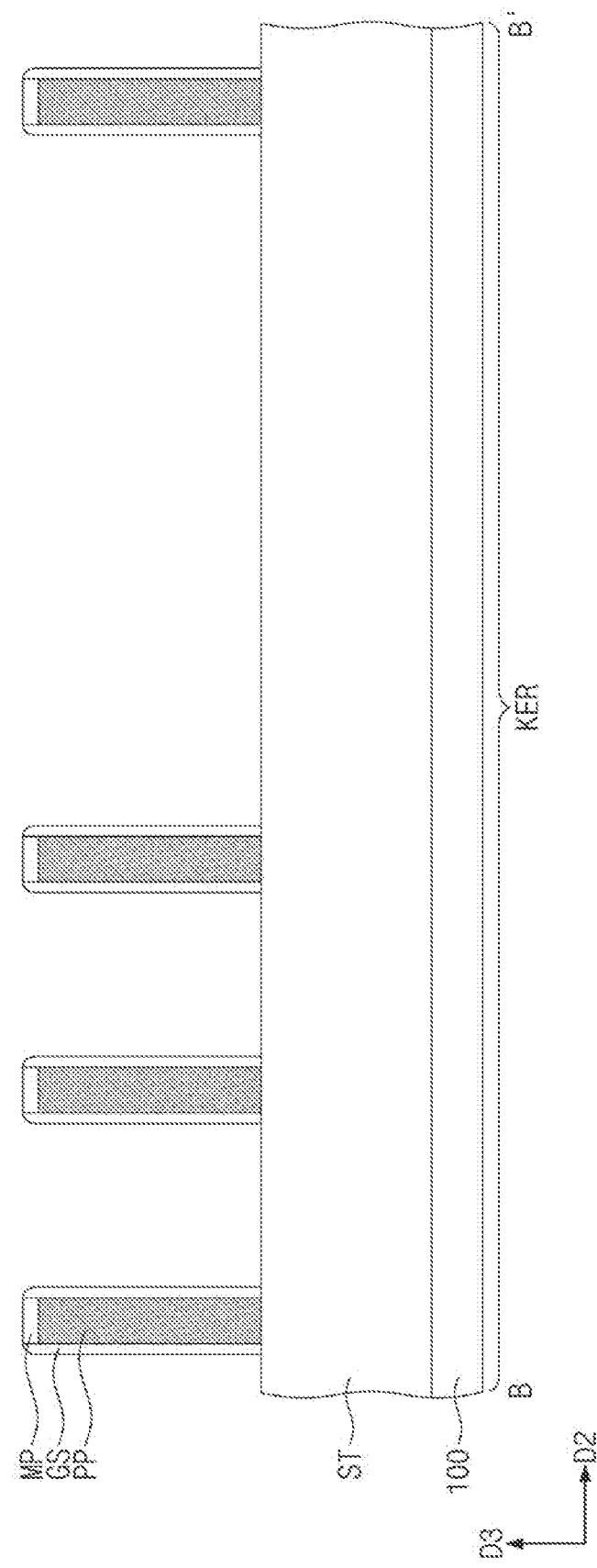
Figure 9C:
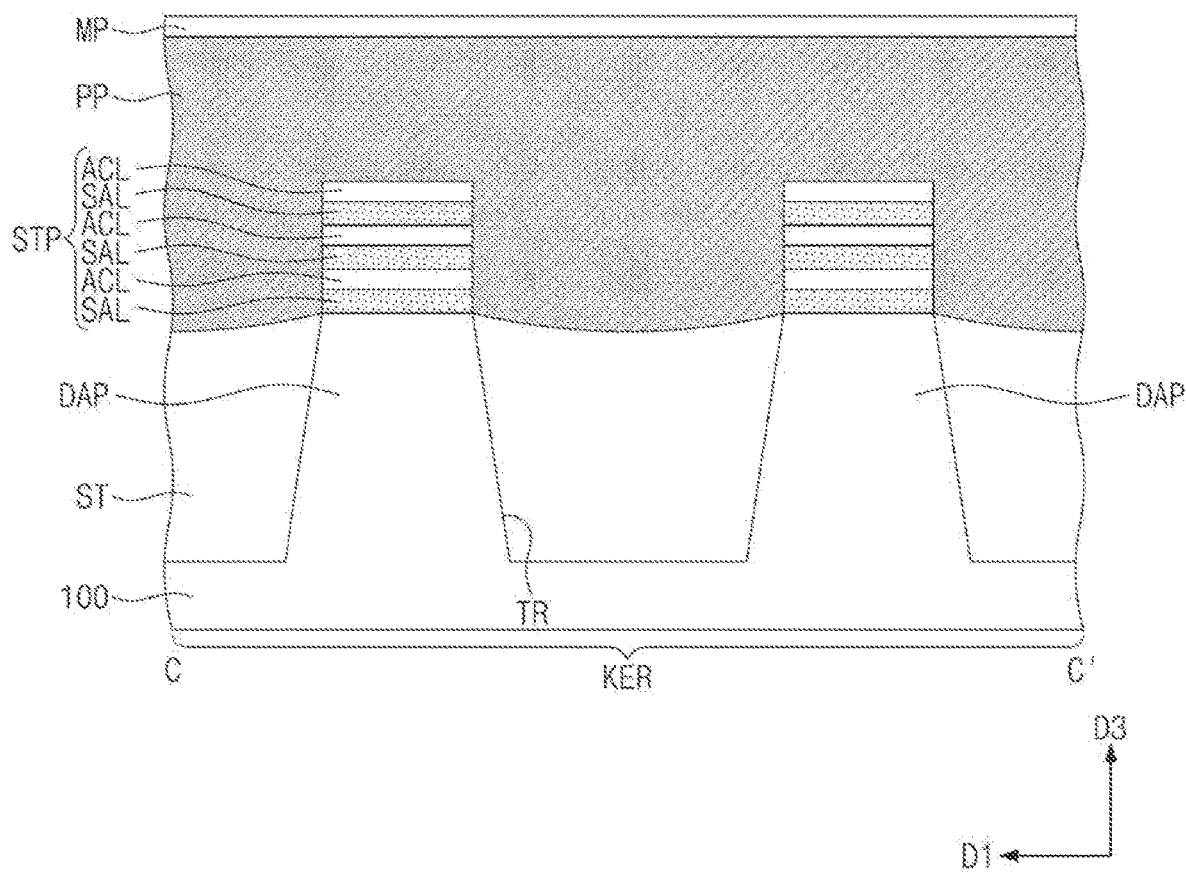
Figure 10:
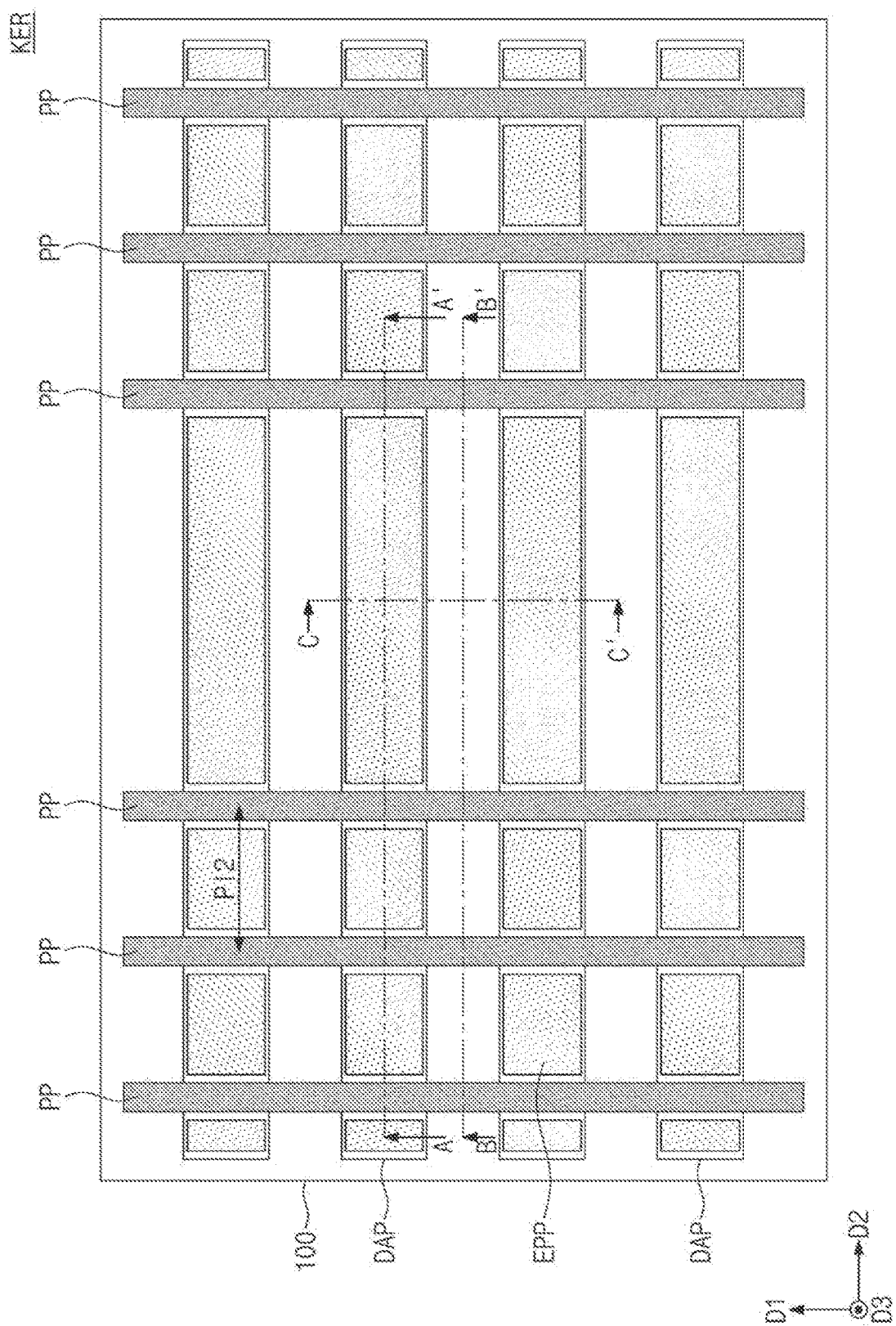
Figure 11A:
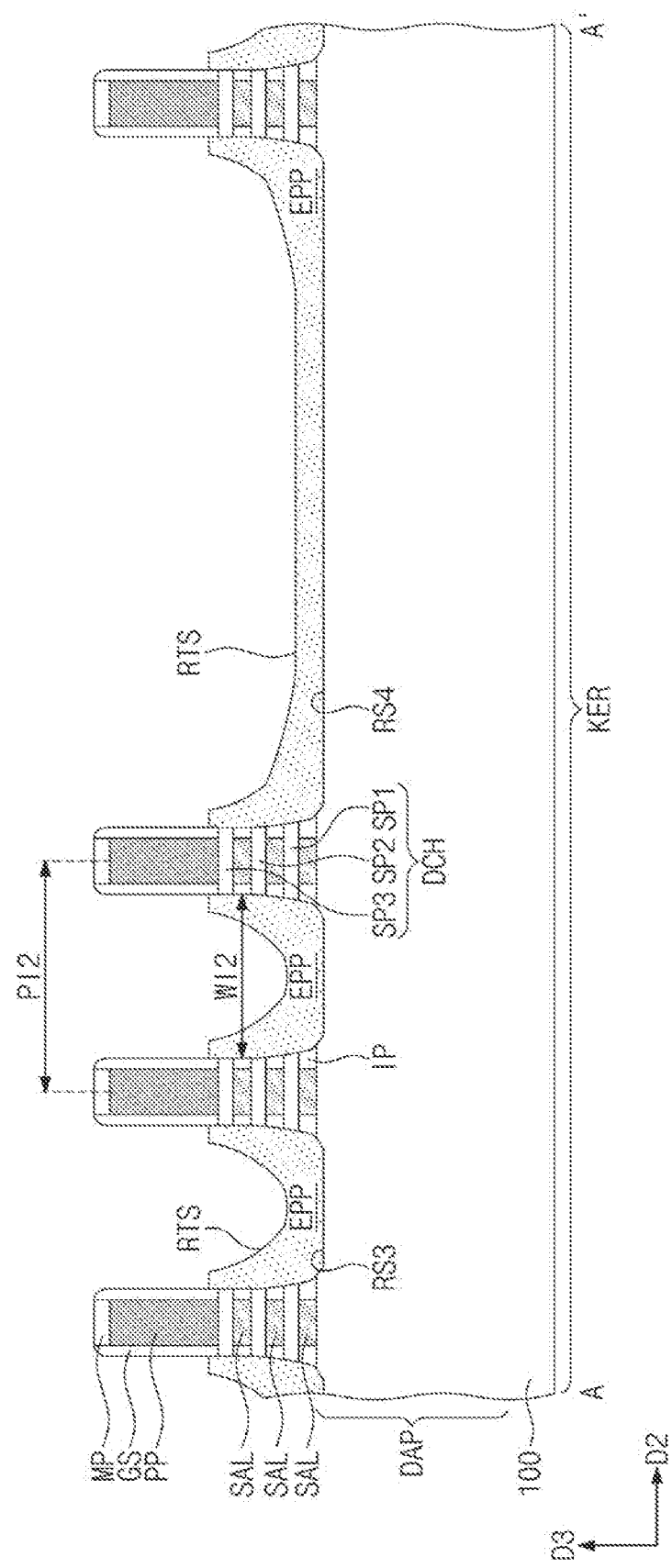
Figure 11B:
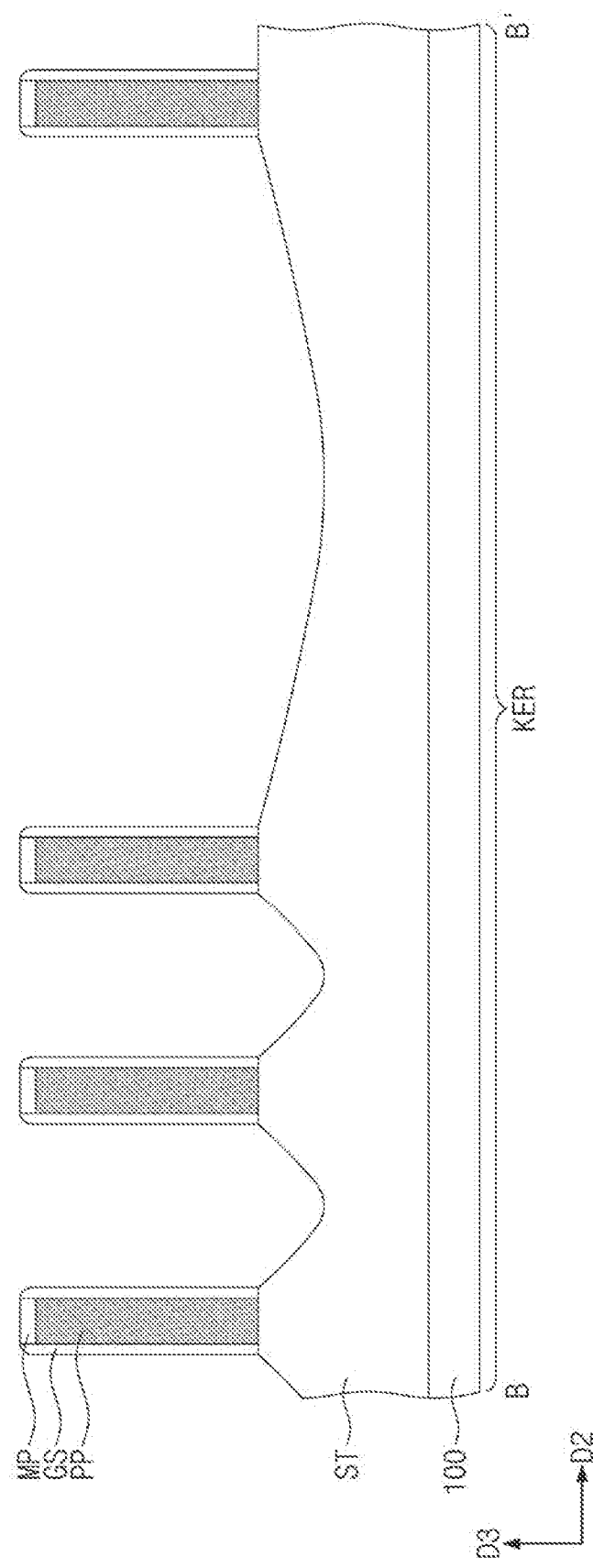
Figure 11C:
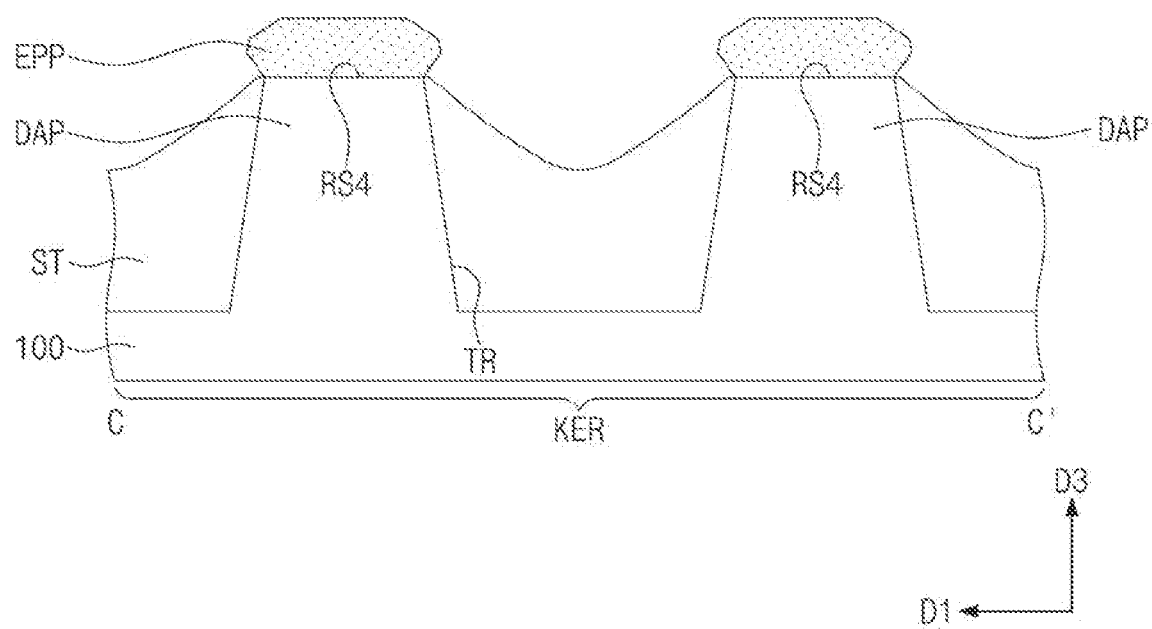
Figure 12:
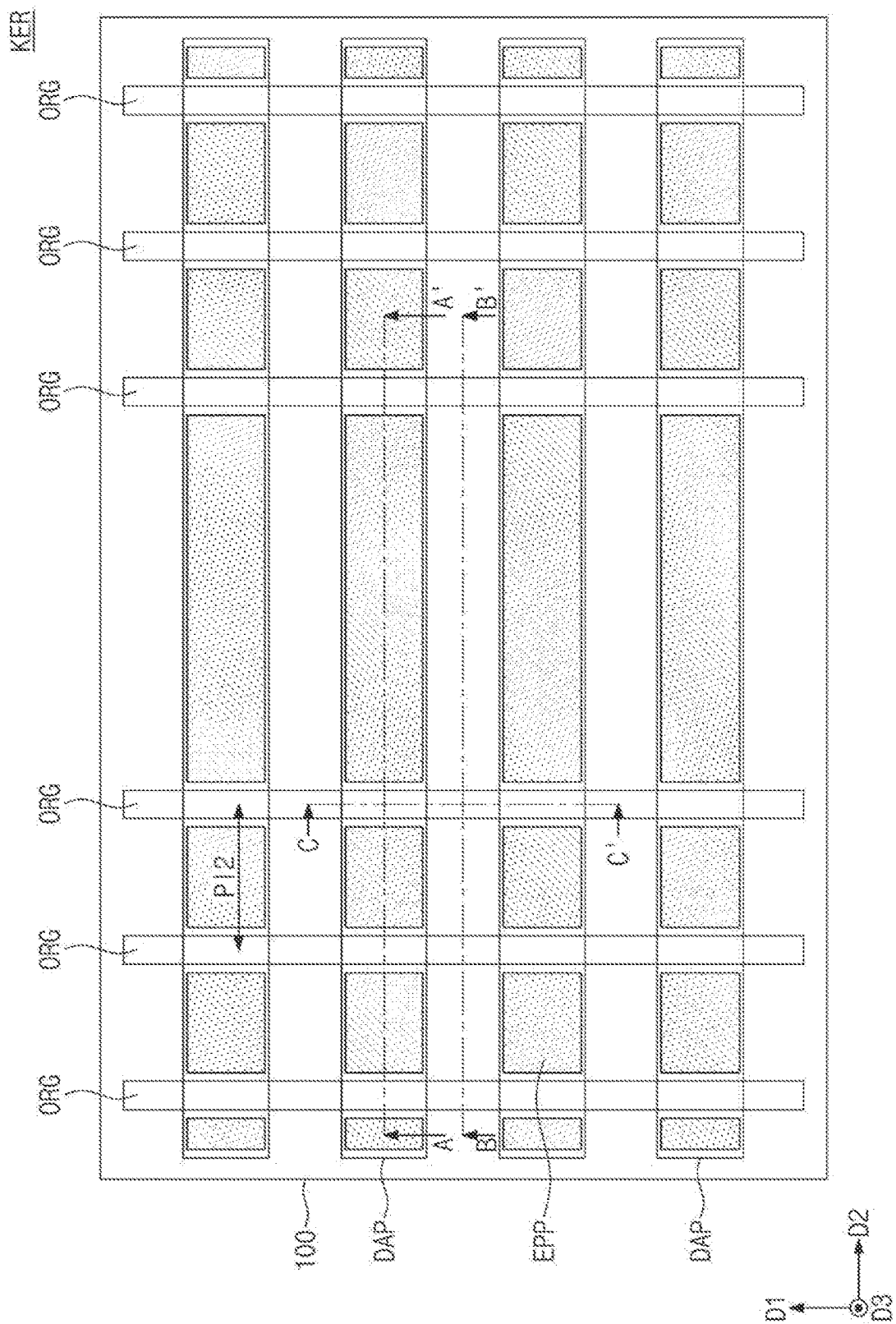

Referring to FIG. 5D, the first sub-key pattern SKP1 may be provided on the top surface TS, the bottom surface BS, and the opposite side surfaces SW of each of the first to third semiconductor patterns SP1, SP2, and SP3. The first sub-key pattern SKP1 may be configured to enclose the top surface TS, the bottom surface BS, and the opposite side surfaces SW of each of the first to third semiconductor patterns SP1, SP2, and SP3. In other words, a lower key structure according to an example embodiment may include a three-dimensional field effect transistor.

Referring to FIGS. 4 and 5A to 5D, a pair of the gate spacers GS may be respectively disposed on opposite side surfaces of the fourth portion PO4 of the first sub-key pattern SKP1. The gate spacers GS may be configured to have substantially the same features as the gate spacers GS on the logic cell region CER described above.

The gate capping pattern GP may be provided on the first sub-key pattern SKP1. The gate capping pattern GP may be configured to have substantially the same features as the gate capping pattern GP on the logic cell region CER described above.

The gate insulating layer GI may be interposed between the first sub-key pattern SKP1 and the dummy channel pattern DCH. The gate insulating layer GI may cover the top surface TS, the bottom surface BS, and the opposite side surfaces SW of each of the first to third semiconductor patterns SP1, SP2, and SP3. The gate insulating layer GI may be configured to have substantially the same features as the gate insulating layer GI on the logic cell region CER described above.

The first to fourth interlayer insulating layers 110-140 may be provided on the key region KER of the substrate 100. The first to fourth interlayer insulating layers 110-140 may be configured to have substantially the same features as the first to fourth interlayer insulating layers 110-140 on the logic cell region CER described above.

The second sub-key patterns SKP2 may be configured to penetrate the first and second interlayer insulating layers 110 and 120 and to extend toward the substrate 100. For example, three second sub-key patterns SKP2 may be disposed between adjacent ones of the first key patterns KP1.

Each of the second sub-key patterns SKP2 may include the conductive pattern FM and the barrier pattern BM, which is configured to enclose the conductive pattern FM. The second sub-key patterns SKP2 and the active contacts AC may be formed simultaneously. In other words, the second sub-key pattern SKP2 may be configured to have substantially the same features as the active contact AC on the logic cell region CER described above.

In an embodiment, the second sub-key pattern SKP2 may be in contact with the epitaxial pattern EPP in the fourth recess RS4. A top surface of the second sub-key pattern SKP2 may be higher than a top surface of the first sub-key pattern SKP1. A bottom surface of the second sub-key pattern SKP2 may be higher than the first portion PO1 of the first sub-key pattern SKP1.

An overlay measurement process may be performed to examine an alignment state of patterns on a semiconductor substrate. As a result of the overlay measurement process, whether the second key pattern KP2 in an upper layer is precisely aligned to the first key pattern KP1 in a lower layer may be examined/determined. According to an example embodiment, the first key pattern KP1 may be a diffraction-based overlay key.

The first key pattern KP1 according to an example embodiment may not be formed on a field oxide layer (i.e., the device isolation layer ST) but may be formed on the dummy active patterns DAP. Since the first key pattern KP1 is provided on silicon-based elements (e.g., the dummy channel pattern DCH and the epitaxial pattern EPP), a signal associated with a diffraction light may be increased. In addition, a noise issue associated with the diffraction light may be reduced. That is, the key pattern according to the disclosure may make improve performance of the overlay measurement process.

FIGS. 6, 8, 10, 12, and 14 are diagrams illustrating a method of fabricating a semiconductor device according to an example embodiment. FIGS. 7A, 9A, 11A, 13A, and 15A are cross-sectional views taken along lines A-A' of FIGS. 6, 8, 10, 12, and 14, respectively, according to an example embodiment. FIGS. 7B, 9B, 11B, 13B, and 15B are cross-sectional views taken along lines B-B' of FIGS. 6, 8, 10, 12, and 14, respectively, according to an example embodiment. FIGS. 7C, 9C, 11C, 13C, and 15C are cross-sectional views taken along lines C-C' of FIGS. 6, 8, 10, 12, and 14, respectively, according to an example embodiment.

Referring to FIGS. 6 and 7A to 7C, the substrate 100 including the key region KER may be provided. For example, the substrate 100 may be a silicon wafer. Active layers ACL and sacrificial layers SAL may be alternately stacked on the substrate 100. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from about 10 at % to about 30 at %.

Mask patterns may be formed on the key region KER of the substrate 100. The mask patterns may be line-shaped or bar-shaped patterns, which are extended in the second direction D2.

A patterning process, in which the mask patterns are used as an etch mask, may be performed to form the trench TR defining the dummy active patterns DAP. A stacking pattern STP may be formed on each of the dummy active patterns DAP. The stacking pattern STP may include the active layers ACL and the sacrificial layers SAL which are alternately stacked. The stacking pattern STP may be formed along with the dummy active patterns DAP, during the patterning process. The first and second active patterns AP1 and AP2 on the logic cell region CER described with reference to FIGS. 2 and 3A to 3D may be formed along with the dummy active patterns DAP.

The device isolation layer ST may be formed to fill the trench TR. In detail, an insulating layer may be formed on the substrate 100 to cover the dummy active patterns DAP and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Referring to FIGS. 8 and 9A to 9C, sacrificial patterns PP may be formed on the substrate 100 to cross the stacking patterns STP. Each of the sacrificial patterns PP may be formed to have a line shape extending in the first direction D1. Three sacrificial patterns PP, which are adjacent to each other, may be arranged at the second pitch PI2 in the second direction D2. The sacrificial patterns PP may be replaced with the first sub-key patterns SKP1, which will be described below.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

According to an example embodiment, a process of forming the hard mask patterns MP may include a lithography process using extreme ultraviolet (EUV) light. In the present specification, the EUV light may have a wavelength ranging from about 4 nm and about 124 nm and, in some embodiments, from about 4 nm and about 20 nm and may be, for example, an ultraviolet light having a wavelength of about 13.5 nm. The EUV light may have an energy of about 6.21 eV to about 124 eV (in some embodiment, from about 90 eV to about 95 eV).

The EUV lithography process may include a step of exposing a photoresist layer to EUV) light and a step of developing the exposed photoresist layer. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the disclosure is not limited to these examples.

The hard mask patterns MP may be formed by patterning one or more mask layers, which are placed below the photoresist patterns, using the photoresist patterns as an etch mask. Desired patterns (e.g., the sacrificial patterns PP) may be formed on the substrate 100 by patterning a target layer (i.e., the sacrificial layer) using the hard mask patterns MP as an etch mask.

In a comparative example of the disclosure, a multi-patterning technology (MPT) using two or more photomasks is required to form fine-pitch patterns on the substrate 100. By contrast, in the case where the EUV lithography process according to an example embodiment is performed, the sacrificial patterns PP may be formed to have a fine pitch, using just one photomask.

For example, the minimum pitch between the sacrificial patterns PP, which are realized by the EUV lithography process according to an example embodiment, may be less than or equal to about 45 nm. In other words, the EUV lithography process may be performed to form the sacrificial patterns PP precisely and finely, without a multi-patterning technology.

A pair of the gate spacers GS may be formed on opposite side surfaces of each of the sacrificial patterns PP. The formation of the gate spacers GS may include conformally forming a gate spacer layer on the substrate 100 and aniso-tropically etching the gate spacer layer. In an embodiment, the gate spacer GS may be a multi-layered structure including at least two layers.

Referring to FIGS. 10 and 11A to 11C, the third and fourth recesses RS3 and RS4 may be formed in the stacking pattern STP on the dummy active patterns DAP. The device isolation layer ST at both sides of the dummy active patterns DAP may be further recessed during the formation of the third and fourth recesses RS3 and RS4 (e.g., see FIGS. 11B and 11C). The first and second recesses RS1 and RS2 described with reference to FIGS. 2 and 3A to 3D may be formed along with the third and fourth recesses RS3 and RS4.

The third recess RS3 may be formed between the sacrificial patterns PP, which are adjacent to each other, to be adjacent to each other at the second pitch PI2. The third recess RS3 may have the second width WI2 in the second direction D2.

The fourth recess RS4 may be formed between three sacrificial patterns PP and three sacrificial patterns PP adjacent thereto. The fourth recess RS4 may have a width greater than the second width WI2, when measured in the second direction D2. A bottom of the fourth recess RS4 may be located at a level that is equal to or lower than a bottom of the third recess RS3.

In detail, the third and fourth recesses RS3 and RS4 may be formed by etching the stacking pattern STP on the dummy active patterns DAP using the mask patterns MP and the gate spacers GS as an etch mask.

The formation of the third and fourth recesses RS3 and RS4 may further include performing a selective etching process on the sacrificial layers SAL exposed. As a result of the selective etching process, each of the sacrificial layers SAL may be horizontally recessed. The inner spacers IP may be formed by filling the recessed sacrificial layers SAL with an insulating material.

During the formation of the third and fourth recesses RS3 and RS4, the active layers ACL may be patterned to form the first to third semiconductor patterns SP1, SP2, and SP3, which are sequentially stacked. The first to third semiconductor patterns SP1, SP2, and SP3, which are sequentially stacked, may constitute the dummy channel pattern DCH. The first and second channel patterns CH1 and CH2 described with reference to FIGS. 2 and 3A to 3D may be formed along with the dummy channel pattern DCH.

The epitaxial patterns EPP may be formed in the third and fourth recesses RS3 and RS4, respectively. In detail, a SEG process, in which an inner surface of each of the third and fourth recesses RS3 and RS4 is used as a seed layer, may be performed to form an epitaxial layer partially filling the third and fourth recesses RS3 and RS4. The epitaxial layer may be grown using the first to third semiconductor patterns SP1, SP2, and SP3 and the substrate 100, which are exposed by the third and fourth recesses RS3 and RS4, as a seed layer. In an embodiment, the SEG process may include a chemical vapor deposition (CVD) process or a molecular beam epitaxy (MBE) process.

In an embodiment, the epitaxial pattern EPP may be formed of or include the same semiconductor material (e.g., Si) as the substrate 100. During the formation of the epitaxial pattern EPP, n-type impurities (e.g., phosphorus, arsenic, or antimony) may be injected into the epitaxial pattern EPP in an in-situ doping manner. Alternatively, the impurities may be injected into the epitaxial pattern EPP, after the formation of the epitaxial pattern EPP.

The second source/drain patterns SD2 described with reference to FIGS. 2 and 3A to 3D may be formed along with the epitaxial patterns EPP. However, since the second width WI2 of the third recess RS3 is greater than the first width WI1 of the second recess RS2, the epitaxial pattern EPP in the third recess RS3 may not fill the entirety of the third recess RS3. The epitaxial pattern EPP in the third recess RS3 may be formed to have the recessed top surface RTS.

Referring to FIGS. 12 and 13A to 13D, the first interlayer insulating layer 110 may be formed to cover the epitaxial patterns EPP, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

The exposed sacrificial patterns PP may be selectively removed. Since the sacrificial patterns PP are moved, an outer region ORG exposing the dummy channel patterns DCH may be formed (e.g., see FIG. 13C). The removal of the sacrificial patterns PP may include a wet etching process which is performed using an etching solution capable of selectively etching polysilicon.

Figure 13A:
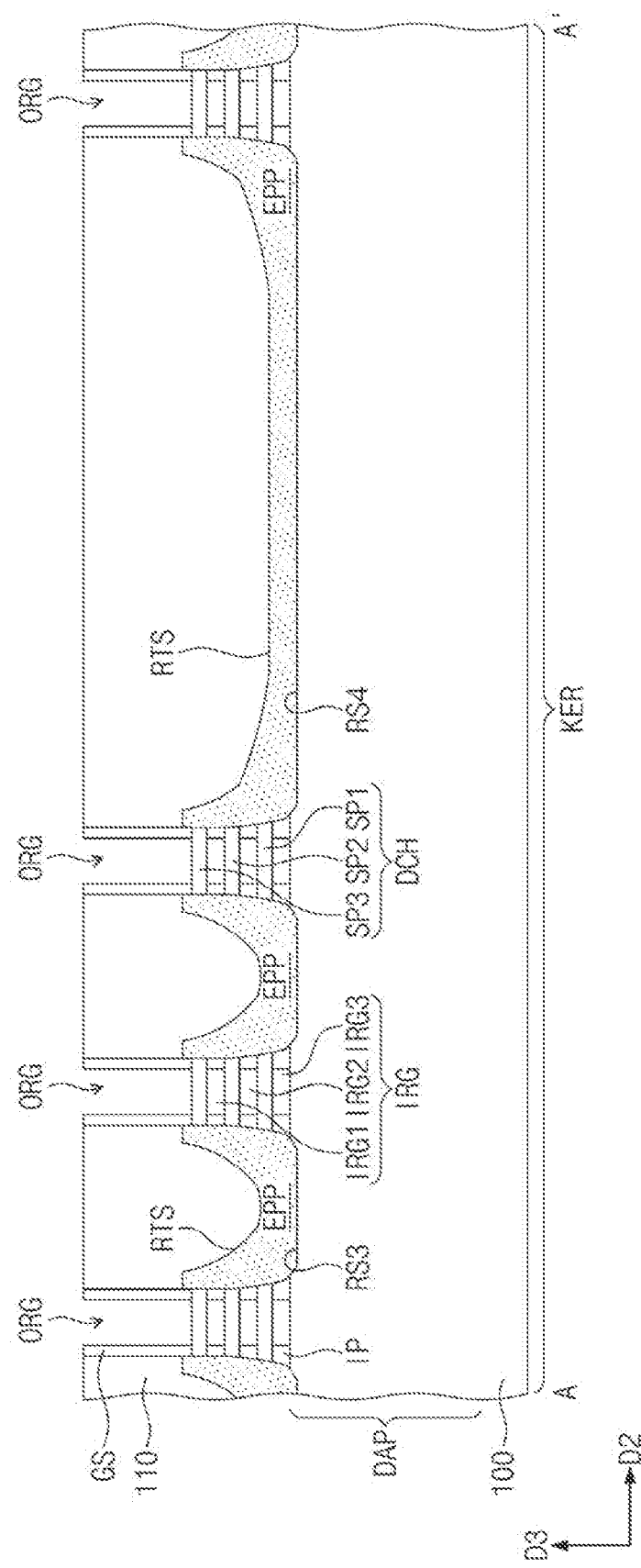
Figure 13B:
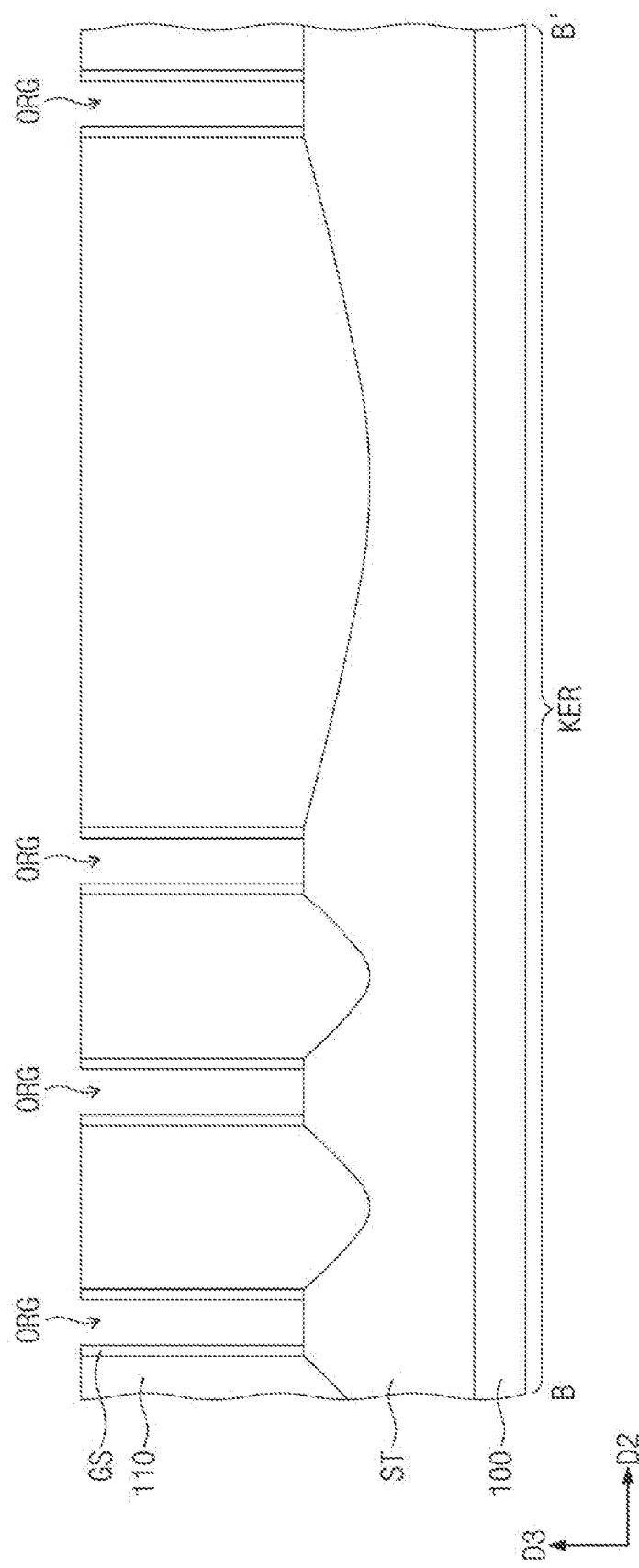
Figure 13C:
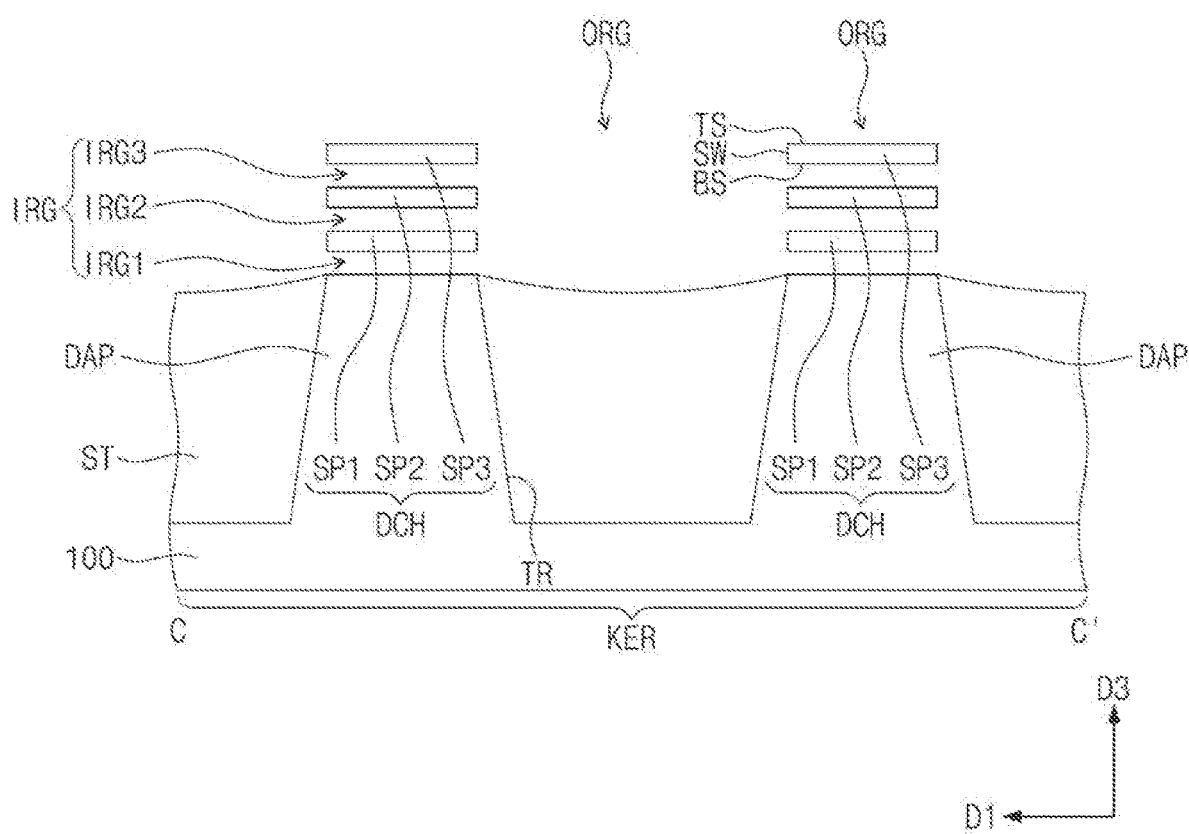
Figure 14:
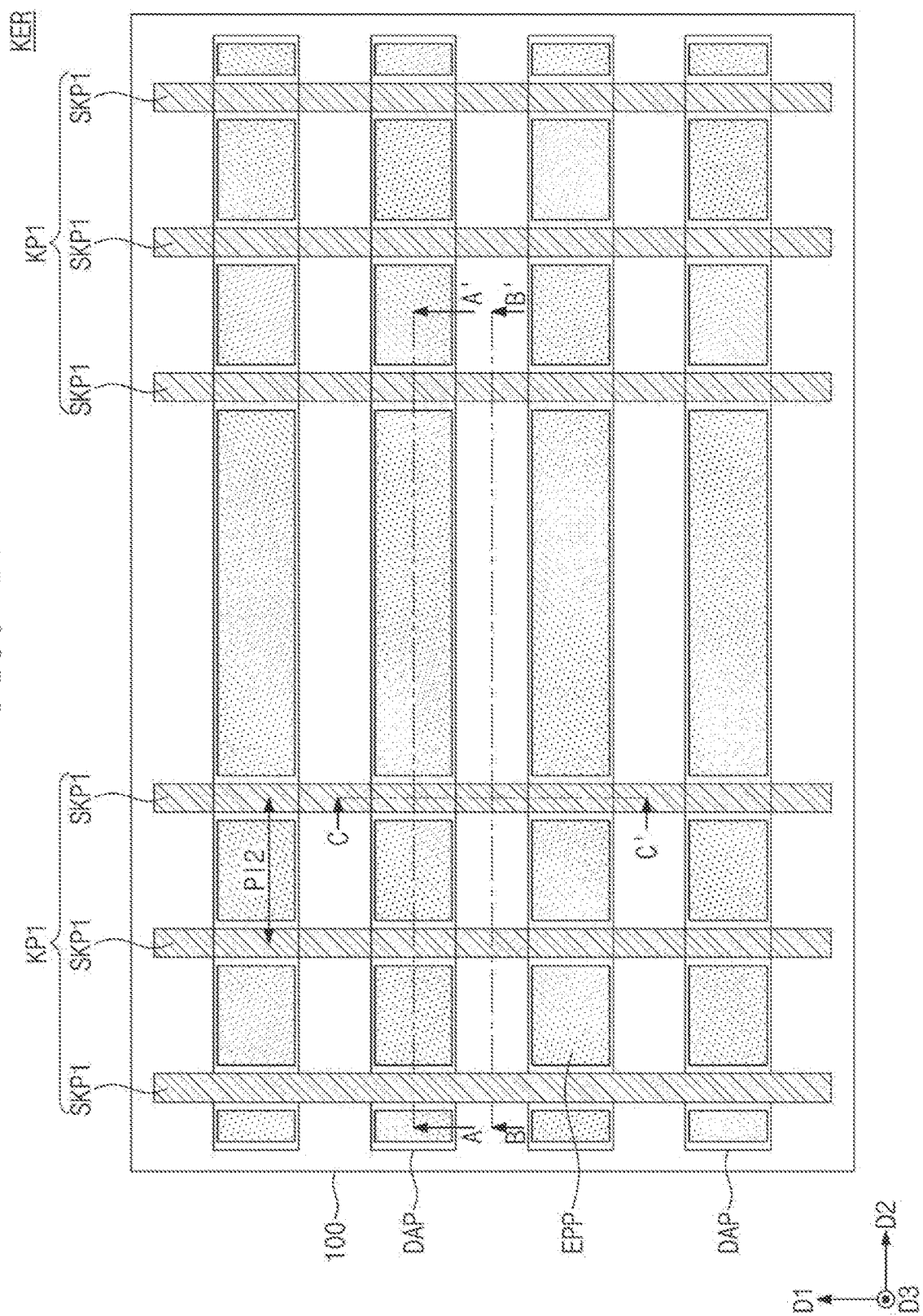
Figure 15A:
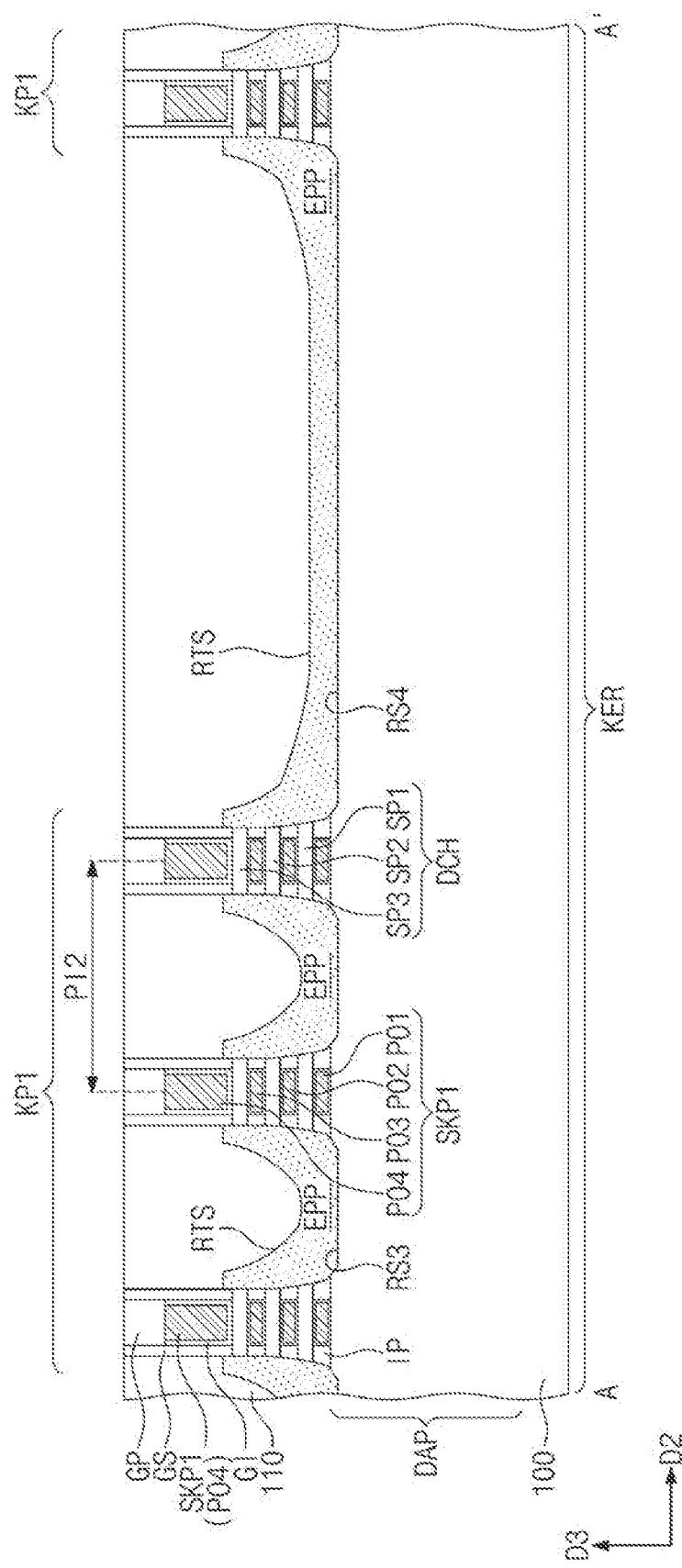
Figure 15B:
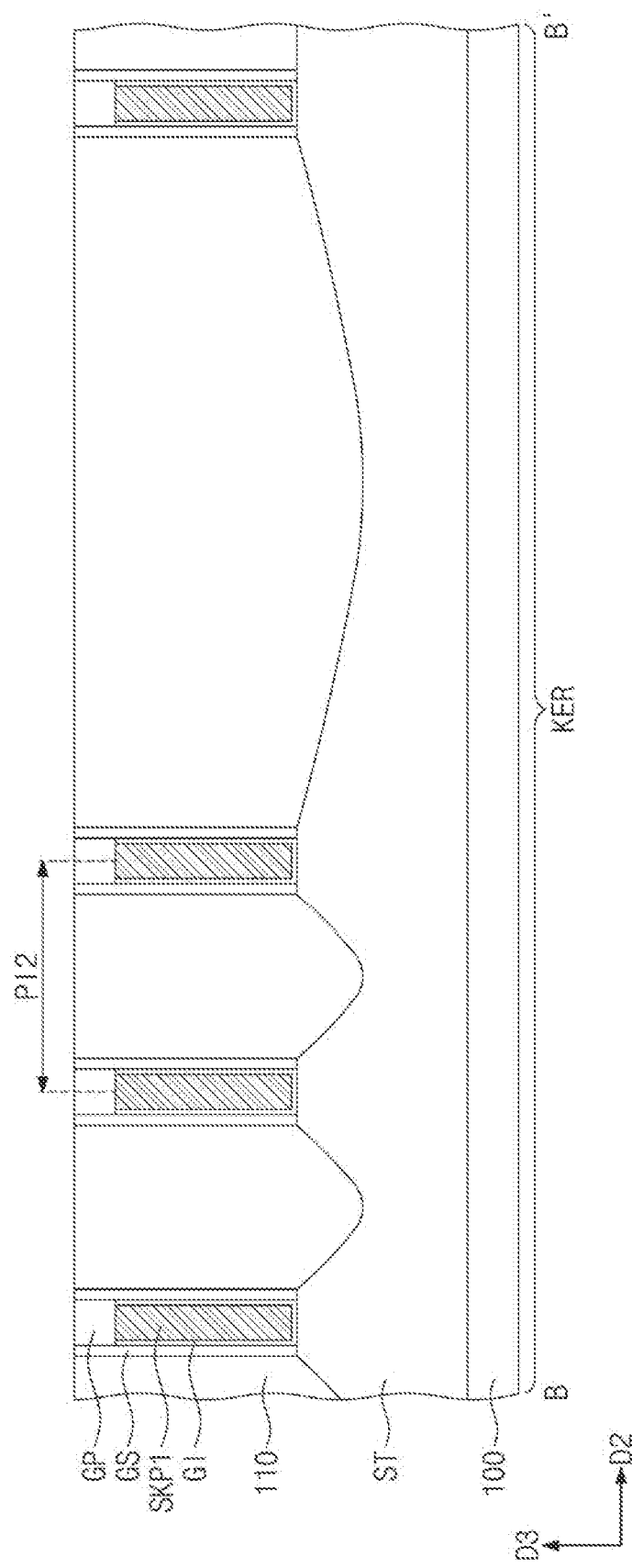
Figure 15C:
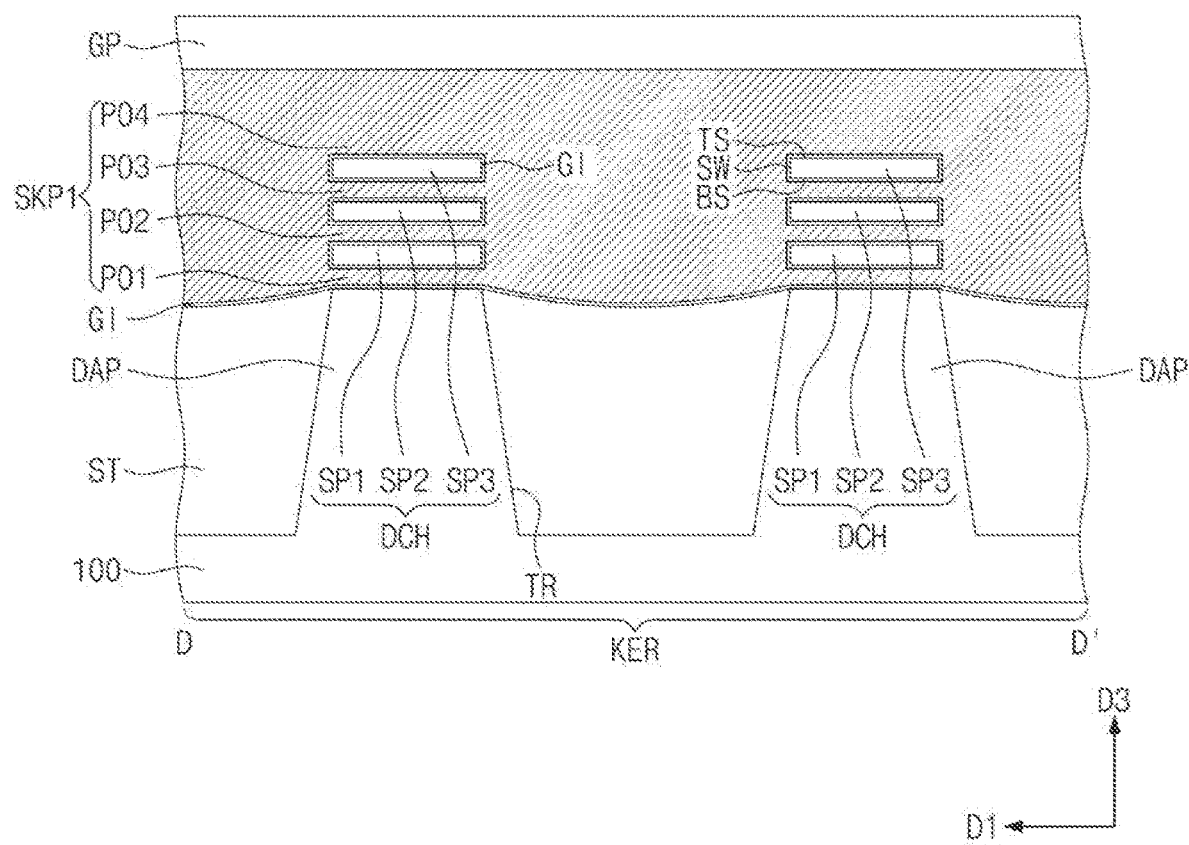

The sacrificial layers SAL exposed through the outer region ORG may be selectively removed to form inner regions IRG (e.g., see FIG. 13C). In detail, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

The sacrificial layers SAL on the dummy active patterns DAP may be removed during the etching process. The etching process may be a wet etching process. An etchant material, which is used in the etching process, may be chosen to quickly remove the sacrificial layer SAL having a relatively high germanium concentration.

Referring back to FIG. 13C, since the sacrificial layers SAL are selectively removed, only the stacked first to third semiconductor patterns SP1, SP2, and SP3 may be left on the dummy active patterns DAP. Empty regions, which are formed by removing the sacrificial layers SAL, may form a first inner region IRG1, a second inner region IRG2, and a third inner region IRG3, respectively.

In detail, the first inner region IRG1 may be formed between the dummy active patterns DAP and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 14 and 15A to FIG. 15C, the gate insulating layer GI may be formed on the exposed first to third semiconductor patterns SP1, SP2, and SP3. The gate insulating layer GI may be formed to enclose each of the first to third semiconductor patterns SP1, SP2, and SP3. For example, the gate insulating layer GI may include an interface layer and a high-k dielectric layer, which are sequentially stacked.

The first sub-key pattern SKP1 may be formed on the gate insulating layer GI. The first sub-key pattern SKP1 may include the first to third portions PO1, PO2, and PO3, which are respectively formed in the first to third inner regions IRG1, IRG2, and IRG3, and the fourth portion PO4, which is formed in the outer region ORG. The first sub-key pattern SKP1 may be recessed to have a reduced height. The gate capping pattern GP may be formed on the recessed first sub-key pattern SKP1. The gate electrodes GE described with reference to FIGS. 2 and 3A to 3D may be formed along with the first sub-key patterns SKP1.

Adjacent ones of the three first sub-key patterns SKP1 may be formed to have the second pitch PI2. Adjacent ones of three first sub-key patterns SKP1 may constitute one first key pattern KP1. In an embodiment, the first key pattern KP1 may be used as the lower overlay key.

Referring back to FIGS. 4 and 5A to 5D, the second interlayer insulating layer 120 may be formed on the first interlayer insulating layer 110. The second interlayer insulating layer 120 may include a silicon oxide layer. The second sub-key patterns SKP2 may be formed to penetrate the second interlayer insulating layer 120 and the first interlayer insulating layer 110. The active contacts AC described with reference to FIGS. 2 and 3A to 3D may be formed along with the second sub-key patterns SKP2.

Three second sub-key patterns SKP2, which are adjacent to each other, may be formed to have the third pitch PI3. Three second sub-key patterns SKP2, which are adjacent to each other, may constitute one second key pattern KP2. The second key pattern KP2 may be formed between adjacent ones of the first key patterns KP1. In an embodiment, the second key pattern KP2 may be used as an upper overlay key.

In a photolithography process for forming the active contacts AC, the first key patterns KP1 formed in the previous step may be used as an overlay key. In an embodiment, the photolithography process may be the afore-described EUV lithography process. After the EUV lithography process, a diffraction light, which is diffracted by the first key patterns KP1, may be measured to determine whether the active contacts AC have a misalignment issue.

The third interlayer insulating layer 130 may be formed on the second interlayer insulating layer 120. The first metal layer M1 previously described with reference to FIGS. 2 and 3A to 3D may be formed in the third interlayer insulating layer 130. The fourth interlayer insulating layer 140 may be formed on the third interlayer insulating layer 130. The second metal layer M2 previously described with reference to FIGS. 2 and 3A to 3D may be formed in the fourth interlayer insulating layer 140.

Hereinafter, various embodiments of the disclosure will be described below. For concise description, an element previously described with reference to FIGS. 4 and 5A to 5D may be identified by the same reference number without repeating an overlapping description thereof.

Figure 16:
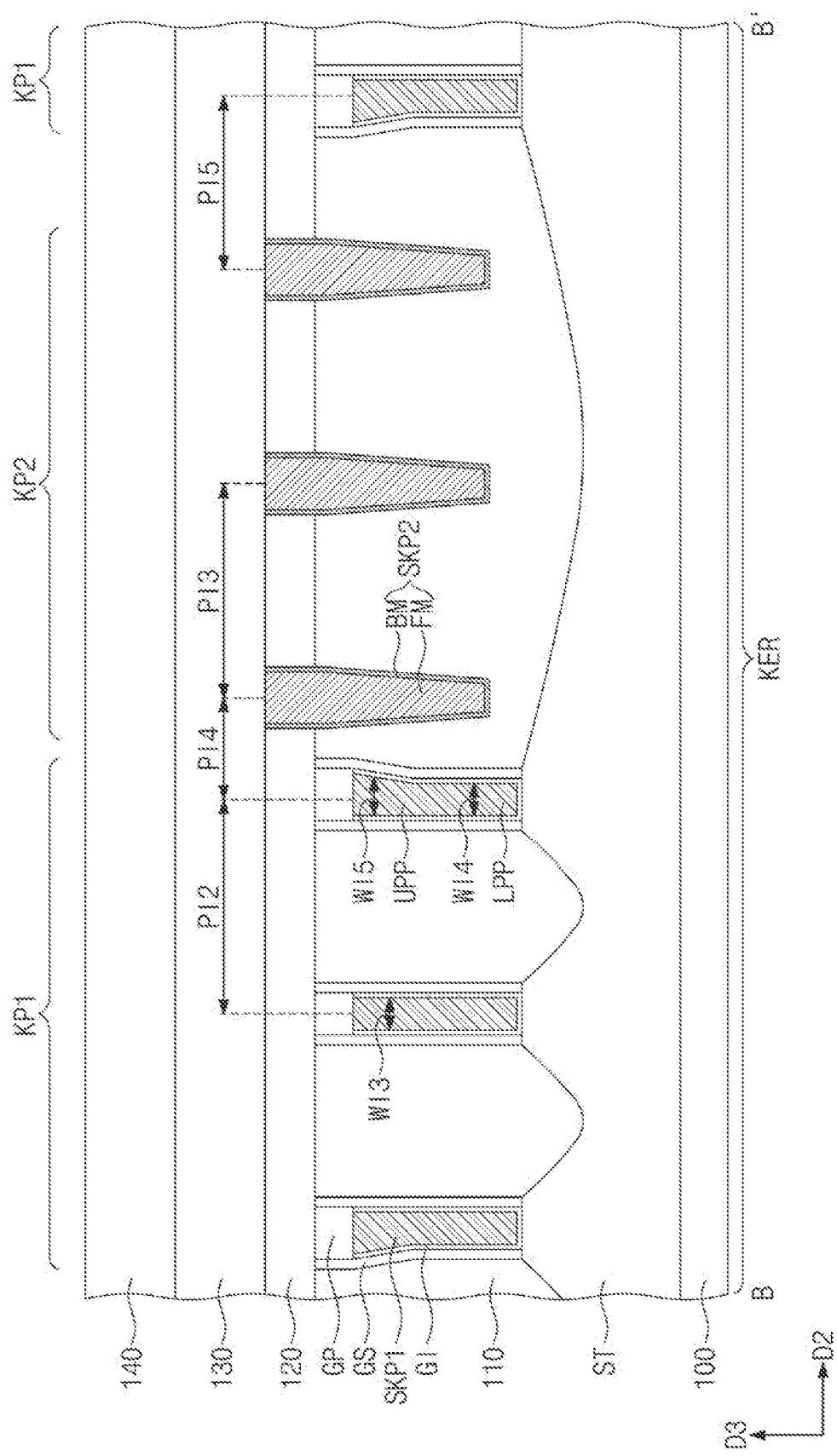
FIG. 16 is a cross-sectional view which is taken along the line B-B' of FIG. 4 illustrating a semiconductor device according to an example embodiment.

FIG. 16 is a cross-sectional view which is taken along the line B-B' of FIG. 4 illustrating a semiconductor device according to an example embodiment. Referring to FIG. 16, the second one of three first sub-key patterns SKP1 may have a third width WI3.

Each of the first and third ones of three first sub-key patterns SKP1 may include a lower portion LPP and an upper portion UPP. The lower portion LPP may have a fourth width WI4, and the upper portion UPP may have a fifth width WI5. The fourth width WI4 may be substantially equal to the third width WI3. The fifth width WI5 may be greater than the fourth width WI4.

Figure 17A:
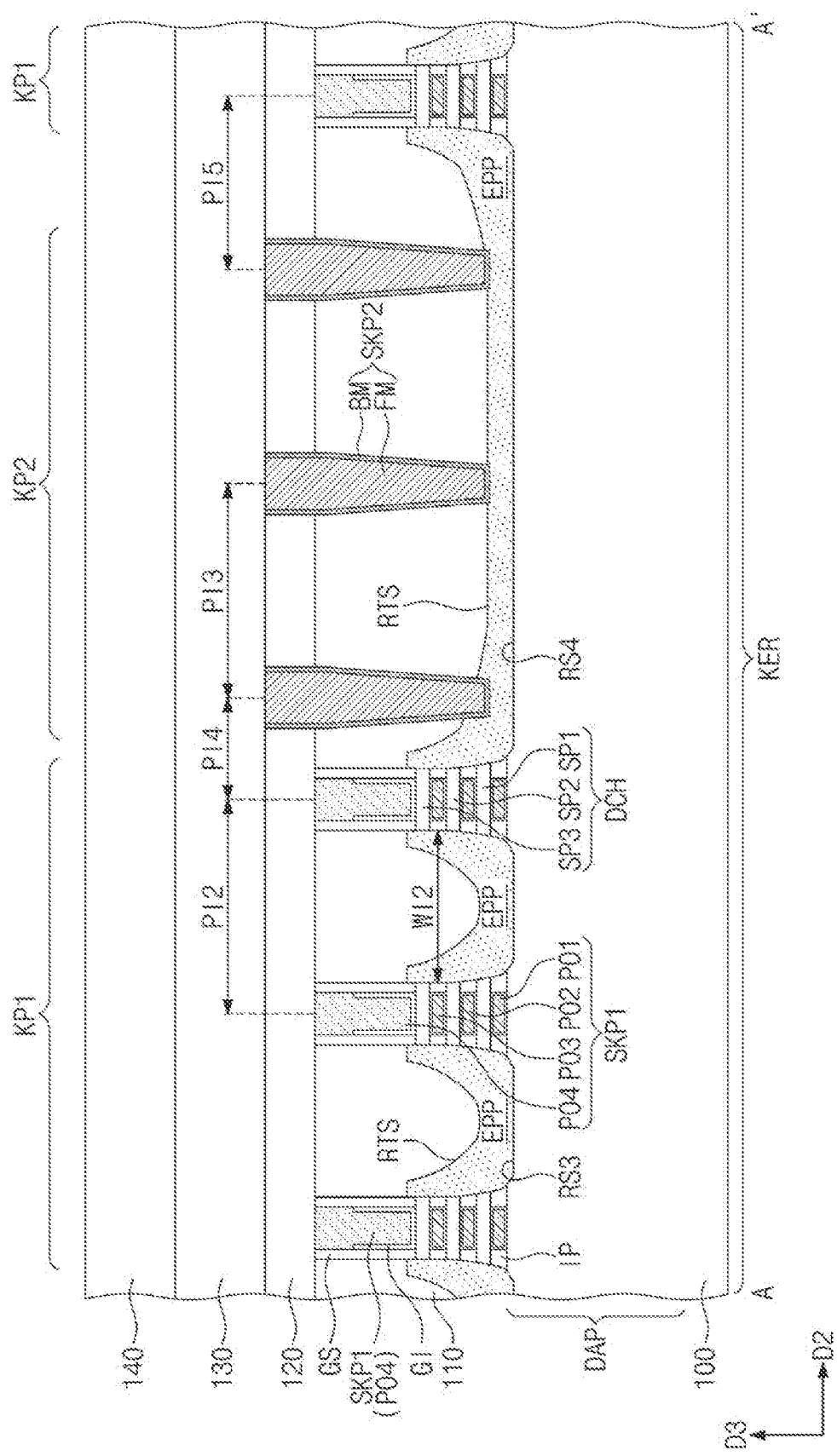
FIGS. 17A and 17B are cross-sectional views, which are respectively taken along the lines A-A' and D-D' of FIG. 4 illustrating a semiconductor device according to an example embodiment.
Figure 17B:
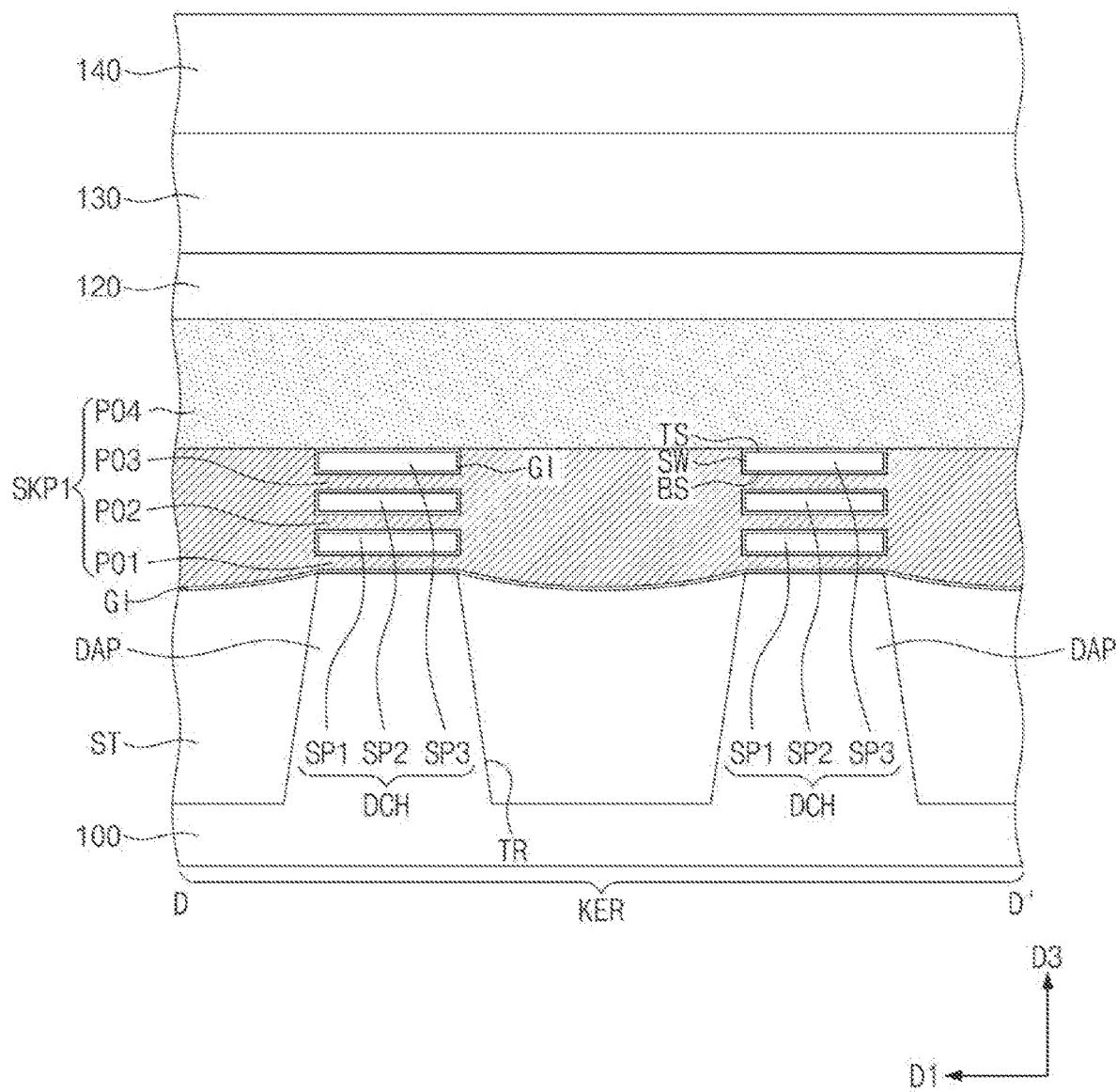

FIGS. 17A and 17B are cross-sectional views, which are respectively taken along the lines A-A' and D-D' of FIG. 4 illustrating a semiconductor device according to an example embodiment. Referring to FIGS. 17A and 17B, the fourth portion PO4 of the first sub-key pattern SKP1 may be formed of or include a material different from the first to third portions PO1, PO2, and PO3.

In an embodiment, the first to third portions PO1, PO2, and PO3 of the first sub-key pattern SKP1 may include a metal nitride layer. However, the fourth portion PO4 of the first sub-key pattern SKP1 may include a silicon nitride layer, a silicon oxide layer, or a silicon oxynitride layer. In an embodiment, the gate capping pattern GP on the fourth portion PO4 may be omitted.

In an example embodiment, a diffraction light (i.e., a diffraction signal) of the first key pattern KP1 may be generated by the first to third portions PO1, PO2, and PO3 and the epitaxial pattern EPP but not by the fourth portion PO4. Similar to the embodiment of FIG. 16 described above, the upper portion UPP (i.e., the fourth portion PO4) of the first sub-key pattern SKP1 may have a deformed shape or an increased width. Thus, in the case where the fourth portion PO4 is replaced with a silicon nitride layer, the precision degree of the diffraction signal may be improved.

In an embodiment, each of the first to third portions PO1, PO2, and PO3 of the first sub-key pattern SKP1 may include a metal nitride layer. However, the fourth portion PO4 of the first sub-key pattern SKP1 may be formed of or include a single metallic material (e.g., tungsten (W)). In an embodiment, the gate capping pattern GP on the fourth portion PO4 may be omitted. In an example embodiment, a diffraction light (i.e., a diffraction signal) of the first key pattern KP1 may be strengthened by the metallic materials of the fourth portion PO4. For example, an intensity of the diffraction signal may be increased. Accordingly, an overlay measurement may be performed in a more precise manner.

Figure 18:
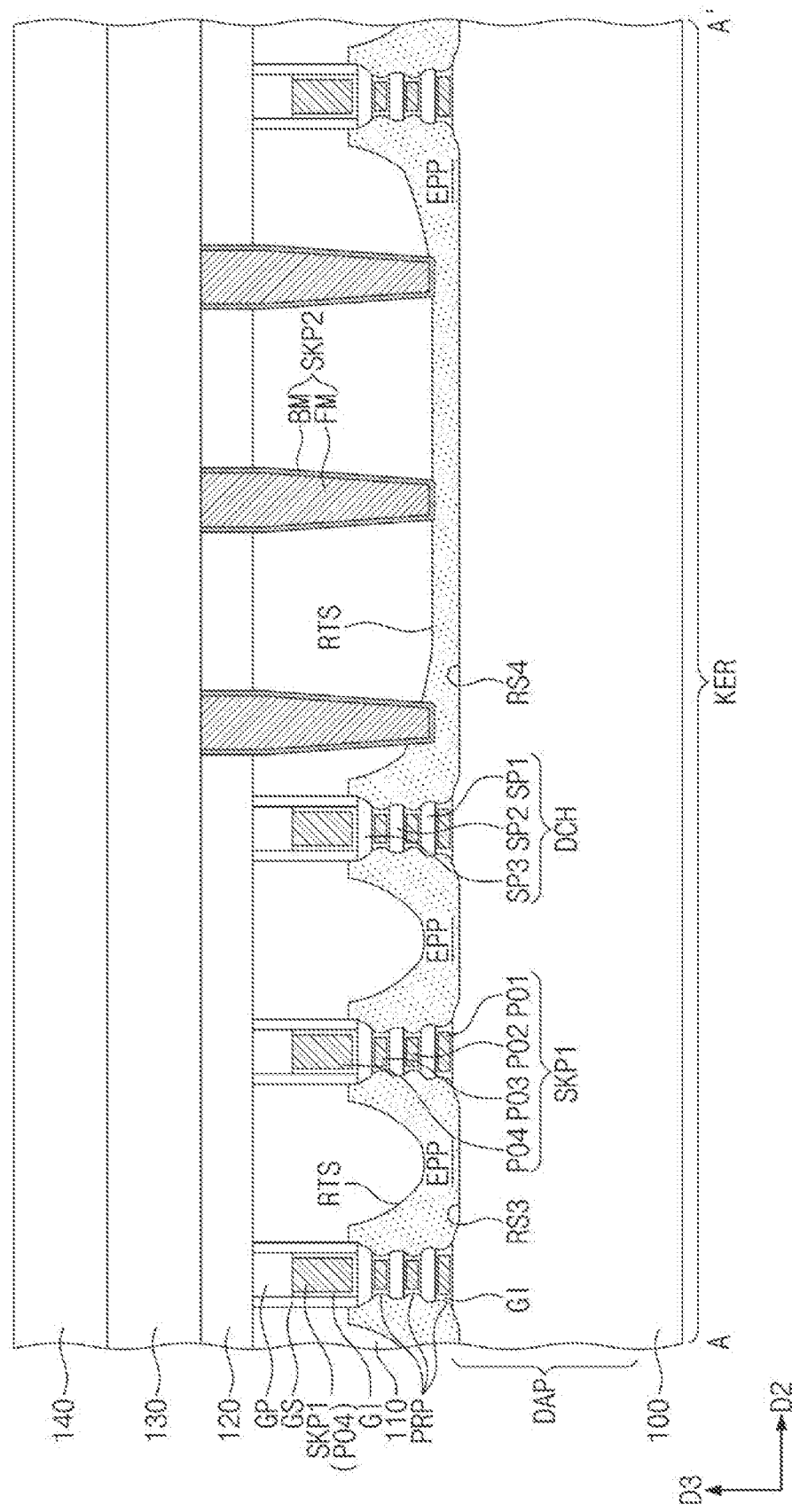
FIG. 18 is a cross-sectional view which is taken along the line A-A' of FIG. 4 illustrating a semiconductor device according to an example embodiment.

FIG. 18 is a cross-sectional view which is taken along the line A-A' of FIG. 4 illustrating a semiconductor device according to an example embodiment. Referring to FIG. 18, the epitaxial pattern EPP may be formed simultaneously when the first source/drain pattern SD1 on the logic cell region CER are formed. In other words, the epitaxial pattern EPP may contain a semiconductor material (e.g., SiGe) whose lattice constant is greater than that of a semiconductor material of the substrate 100. The epitaxial pattern EPP may have a first conductivity type (e.g., p-type).

The epitaxial pattern EPP may include a plurality of protruding portions PRP provided on a side surface thereof. The protruding portions PRP may protrude toward the first to third portions PO1, PO2, and PO3 of the first sub-key pattern SKP1. The gate insulating layer GI may directly cover the protruding portions PRP. In an embodiment, the inner spacers IP between the first to third portions PO1, PO2, and PO3 and the epitaxial pattern EPP may be omitted.

Figure 19:
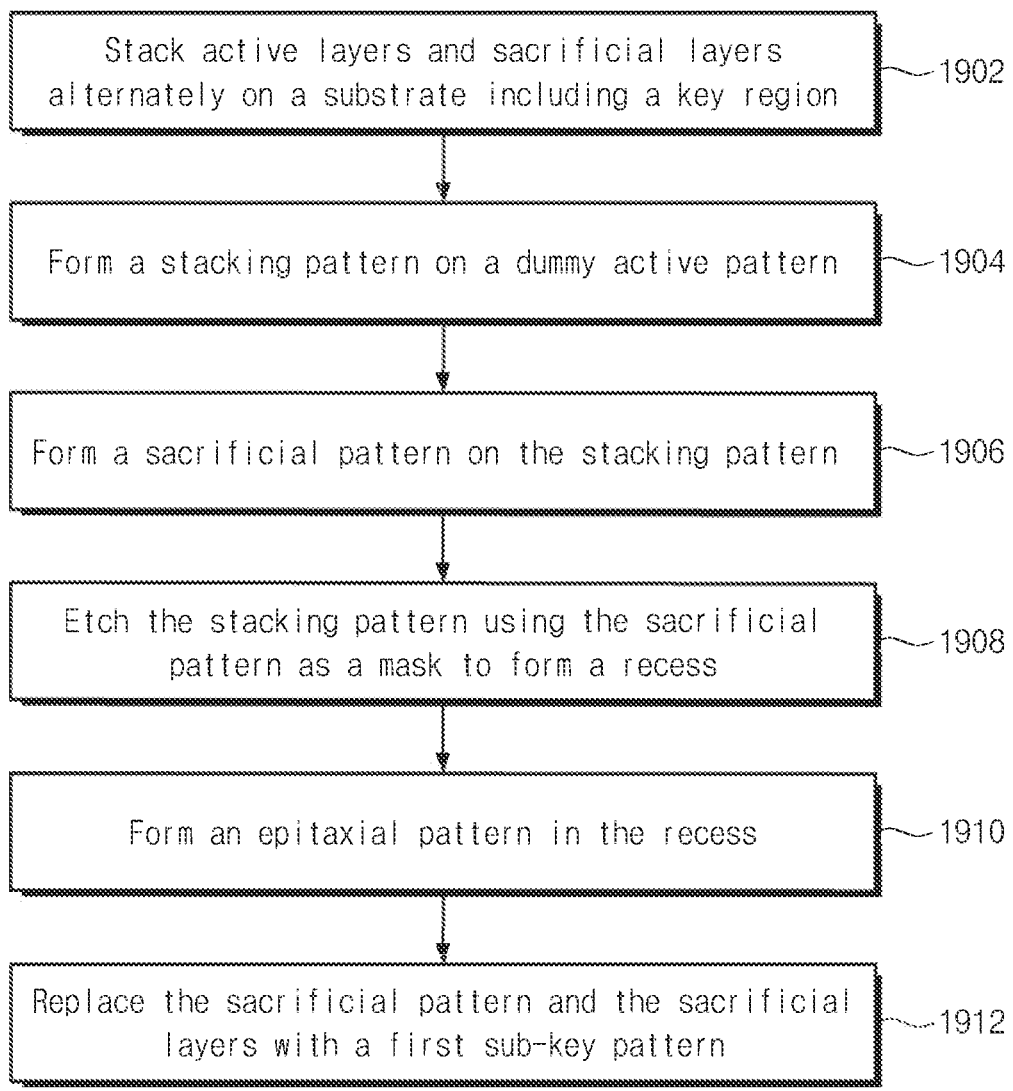
FIG. 19 is a flowchart of a method of fabricating a semiconductor device, according to an example embodiment.

FIG. 19 is a flowchart of a method of fabricating a semiconductor device, according to an example embodiment. In operation 1902, active layers and sacrificial layers may be alternately stacked on a substrate including a key region. In operation 1904, a stacking pattern may be formed on a dummy active pattern, and the stacking pattern may include the active layers and the sacrificial layers. In operation 1906, a sacrificial pattern may be formed on the stacking pattern. In operation 1908, the stacking pattern may be etched using the sacrificial pattern as a mask to form a recess. In operation 1910, an epitaxial pattern may be formed in the recess, the epitaxial pattern including a recessed top surface. In operation 1912, the sacrificial pattern and the sacrificial layers may be replaced with a first sub-key pattern. The method may further include forming a second sub-key pattern adjacent to the first sub-key pattern, and the forming of the second sub-key pattern may include detecting a diffraction light of the first sub-key pattern determine whether the second sub-key pattern has a misalignment issue. A bottom surface of the second sub-key pattern may be located at a level higher than a lowermost portion of the first sub-key pattern. The method may further include forming inner spacers interposed between the sacrificial layers and the epitaxial pattern. The active layers may include a dummy channel pattern, and the method may further include forming a gate insulating layer between the first sub-key pattern and the dummy channel pattern.

A dummy nanosheet, which may be the same as a cell, may be formed in a key region (e.g., a scribe line). A lower key pattern may be formed, in a y direction, using a gate forming process. An upper key pattern may be formed. Since the key region experiences the same process as the cell region, a space between the dummy nanosheets may be filled with a gate metal material. A U-shaped epitaxial pattern may be formed between the lower key patterns, which may be adjacent to each other.

According to an example embodiment, a key pattern, which is similar to a GAAFET structure on a cell region, may be provided on a key region. The key pattern and an epitaxial pattern adjacent thereto may be used to increase an intensity of a diffraction signal and an accuracy of an overlay measurement process. Accordingly, due to the key pattern, a semiconductor device with a high integration density and high reliability may be realized.

Although the disclosure been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A semiconductor device, comprising:
a substrate comprising a key region;
a dummy active pattern provided on the key region;
a dummy channel pattern provided on the dummy active pattern, the dummy channel pattern comprising a first plurality of semiconductor patterns spaced apart from each other;
an epitaxial pattern connected to the dummy channel pattern; and
a first sub-key pattern provided on the dummy channel pattern,
wherein the first sub-key pattern encloses a top surface, a bottom surface, and side surfaces of each of the first plurality of semiconductor patterns.

2. The semiconductor device of claim 1, wherein the epitaxial pattern comprises a recessed top surface.

3. The semiconductor device of claim 1, wherein the first sub-key pattern comprises a portion provided between adjacent semiconductor patterns of the first plurality of semiconductor patterns.

4. The semiconductor device of claim 3, further comprising an inner spacer provided between the portion of the first sub-key pattern and the epitaxial pattern.

5. The semiconductor device of claim 1, further comprising a gate insulating layer provided between the first sub-key pattern and the dummy channel pattern,
wherein the gate insulating layer directly covers the top surface, the bottom surface, and the side surfaces of each of the first plurality of semiconductor patterns.

6. The semiconductor device of claim 1, further comprising a second sub-key pattern that is adjacent to the first sub-key pattern,
wherein the second sub-key pattern comprises a conductive pattern and a barrier pattern enclosing the conductive pattern.

7. The semiconductor device of claim 6, wherein a bottom surface of the second sub-key pattern is located at a level higher than a lowermost portion of the first sub-key pattern.

8. The semiconductor device of claim 1, further comprising:
a second active pattern provided on a logic cell region of the substrate;
a second channel pattern provided on the second active pattern;
a source/drain pattern connected to the second channel pattern; and
a gate electrode provided on the second channel pattern,
wherein a width of the epitaxial pattern is greater than a width of the source/drain pattern.

9. The semiconductor device of claim 8, wherein the second channel pattern comprises a second plurality of semiconductor patterns spaced apart from each other, and
wherein the gate electrode encloses a top surface, a bottom surface, and side surfaces of each of the second plurality of semiconductor patterns of the second channel pattern.

10. The semiconductor device of claim 8, wherein the gate electrode comprises gate electrodes adjacent to each other and are spaced apart from each other at a first pitch,
wherein the first sub-key pattern comprises first sub-key patterns adjacent to each other and are spaced apart from each other at a second pitch, and
wherein the second pitch is greater than the first pitch.

11. A semiconductor device, comprising:
a substrate comprising a key region;
a dummy active pattern provided on the key region;
a first dummy channel pattern and a second dummy channel pattern provided on the dummy active pattern, the first dummy channel pattern and the second dummy channel pattern being adjacent to each other;
an epitaxial pattern provided between the first dummy channel pattern and the second dummy channel pattern;
a first sub-key pattern provided on the first dummy channel pattern; and
a second sub-key pattern provided on the second dummy channel pattern,
wherein the epitaxial pattern comprises a recessed top surface.

12. The semiconductor device of claim 11, wherein a height of the epitaxial pattern is decreased and then increased in a direction from the first dummy channel pattern toward the second dummy channel pattern.

13. The semiconductor device of claim 11, further comprising:
a second active pattern on a logic cell region of the substrate;
a third channel pattern and a fourth channel pattern provided on the second active pattern, the third channel pattern and the fourth channel pattern being are adjacent to each other;
a source/drain pattern provided between the third channel pattern and the fourth channel pattern; and
gate electrodes provided on the third channel pattern and the fourth channel pattern,
wherein a first pitch between the gate electrodes is less than a second pitch between the first sub-key pattern and the second sub-key pattern.

14. The semiconductor device of claim 11, further comprising a third sub-key pattern adjacent to the second sub-key pattern,
wherein a pitch between the first sub-key pattern and the second sub-key pattern is greater than a pitch between the second sub-key pattern on the second dummy channel pattern and the third sub-key pattern.

15. The semiconductor device of claim 14, wherein a bottom surface of the third sub-key pattern is located at a level higher than a lowermost portion of each of the first sub-key pattern and the second sub-key pattern.

16. A semiconductor device, comprising:
a substrate comprising a key region;
a dummy active pattern provided on the key region;
a first dummy channel pattern and a second dummy channel pattern provided on the dummy active pattern and spaced apart from each other;
a first sub-key pattern provided on the first dummy channel pattern;

a second sub-key pattern provided on the second dummy channel pattern; and a plurality of third sub-key patterns provided between the first sub-key pattern and the second sub-key pattern, wherein a distance between the first sub-key pattern on the first dummy channel pattern and one of the plurality of third sub-key patterns adjacent thereto is a first pitch, wherein a distance between the second sub-key pattern on the second dummy channel pattern and one of the plurality of third sub-key patterns adjacent thereto is a second pitch, and wherein the first pitch and the second pitch are different from each other.

17. The semiconductor device of claim 16, further comprising an epitaxial pattern provided between the first dummy channel pattern and the second dummy channel pattern, wherein the plurality of third sub-key patterns are connected to the epitaxial pattern.

18. The semiconductor device of claim 16, wherein a bottom surface of each of the plurality of third sub-key patterns is located at a level higher than a lowermost portion of each of the first sub-key pattern and the second sub-key pattern.

19. The semiconductor device of claim 16, further comprising:

a second active pattern provided on a logic cell region of the substrate;

a third channel pattern and a fourth channel pattern provided on the second active pattern, the third channel pattern and the fourth channel pattern being adjacent to each other;

a source/drain pattern provided between the third channel pattern and the fourth channel pattern; and gate electrodes provided on the third channel pattern and the fourth channel pattern, wherein a pitch between the gate electrodes is less than a pitch between the plurality of third sub-key patterns.

20. The semiconductor device of claim 16, wherein each of the first dummy channel pattern and the second dummy channel pattern comprises a plurality of semiconductor patterns spaced apart from each other, and wherein the first sub-key pattern encloses a top surface, a bottom surface, and side surfaces of each of the plurality of semiconductor patterns.

\* \* \* \* \*